US012597902B2

(12) United States Patent
Deniz et al.

(10) Patent No.: US 12,597,902 B2
(45) Date of Patent: Apr. 7, 2026

(54) PIEZOELECTRIC BULK LAYERS WITH TILTED C-AXIS ORIENTATION AND METHODS FOR MAKING THE SAME

(71) Applicant: Qorvo US, Inc., Greensboro, NC (US)

(72) Inventors: Derya Deniz, McKinney, TX (US); Robert Kraft, Plano, TX (US); John Belsick, Bend, OR (US)

(73) Assignee: Qorvo US, Inc., Greensboro, NC (US)

( * ) Notice: Subject to any disclaimer, the term of this patent is extended or adjusted under 35 U.S.C. 154(b) by 1001 days.

(21) Appl. No.: 17/742,827

(22) Filed: May 12, 2022

(65) Prior Publication Data

US 2022/0271726 A1      Aug. 25, 2022

Related U.S. Application Data

(63) Continuation of application No. 16/359,575, filed on Mar. 20, 2019, now Pat. No. 11,381,212.
(Continued)

(51) Int. Cl.
*H03H 3/02* (2006.01)
*C23C 14/00* (2006.01)
(Continued)

(52) U.S. Cl.
CPC ........... *H03H 3/02* (2013.01); *C23C 14/0036* (2013.01); *C23C 14/226* (2013.01);
(Continued)

(58) Field of Classification Search
CPC .. H03H 3/02; H03H 9/02007; H03H 9/02031; H03H 9/54; H03H 9/02015;
(Continued)

(56) References Cited

U.S. PATENT DOCUMENTS

| 3,766,041 A | 10/1973 | Wasa et al. |
| 3,781,721 A | 12/1973 | Judd et al. |

(Continued)

FOREIGN PATENT DOCUMENTS

| CN | 113098432 A | 7/2021 |
| JP | 0693435 A | 4/1994 |

(Continued)

OTHER PUBLICATIONS

International Patent Application No. PCT/US2020/050333 filed Sep. 11, 2020; International Search Report and Written Opinion dated Dec. 21, 2020, 8 pages.

(Continued)

*Primary Examiner* — Emily P Pham
(74) *Attorney, Agent, or Firm* — Haynes and Boone, LLP

(57) ABSTRACT

Bulk acoustic wave resonator structures include a bulk layer with inclined c-axis hexagonal crystal structure piezoelectric material supported by a substrate. The bulk layer may be prepared without first depositing a seed layer on the substrate. The bulk material layer has a c-axis tilt of about 32 degrees or greater. The bulk material layer may exhibit a ratio of shear coupling to longitudinal coupling of 1.25 or greater during excitation. A method for preparing a crystalline bulk layer having a c-axis tilt includes depositing a bulk material layer directly onto a substrate at an off-normal incidence. The deposition conditions may include a pressure of less than 5 mTorr and a deposition angle of about 35 degrees to about 85 degrees.

17 Claims, 12 Drawing Sheets

Related U.S. Application Data

(60) Provisional application No. 62/646,212, filed on Mar. 21, 2018.

(51) Int. Cl.

| | |
|---|---|
| *C23C 14/22* | (2006.01) |
| *H01J 37/34* | (2006.01) |
| *H03H 9/02* | (2006.01) |
| *H03H 9/54* | (2006.01) |

(52) U.S. Cl.
CPC ...... *H01J 37/3408* (2013.01); *H01J 37/3447* (2013.01); *H03H 9/02007* (2013.01); *H03H 9/02031* (2013.01); *H03H 9/54* (2013.01)

(58) Field of Classification Search
CPC .............. H01J 37/3408; H01J 37/3447; C23C 14/0036; C23C 14/226; C23C 14/024; C23C 14/0617; C30B 23/00; C30B 29/16; C30B 29/403
See application file for complete search history.

(56) References Cited

U.S. PATENT DOCUMENTS

| | | | |
|---|---|---|---|
| 3,846,349 | A | 11/1974 | Harada |
| 3,846,649 | A | 11/1974 | Lehmann |
| 4,320,320 | A | 3/1982 | Momosaki et al. |
| 4,640,756 | A | 2/1987 | Wang et al. |
| 4,719,383 | A | 1/1988 | Wang et al. |
| 4,917,556 | A | 4/1990 | Stark et al. |
| 5,178,739 | A | 1/1993 | Barnes et al. |
| 5,473,216 | A | 12/1995 | Brosig et al. |
| 5,518,594 | A | 5/1996 | Marcquart et al. |
| 5,728,276 | A | 3/1998 | Katsuki et al. |
| 5,958,193 | A | 9/1999 | Brugge |
| 5,961,269 | A | 10/1999 | Kroeker |
| 6,827,824 | B1 | 12/2004 | Blalock et al. |
| 6,831,525 | B1 | 12/2004 | Beaudin et al. |
| 7,014,887 | B1 | 3/2006 | Cohen et al. |
| 7,033,461 | B2 | 4/2006 | Tani et al. |
| 7,047,792 | B1 | 5/2006 | Bhethanabotla et al. |
| 7,388,281 | B2 | 6/2008 | Krueger |
| 7,468,608 | B2 | 12/2008 | Feucht et al. |
| 7,675,388 | B2 | 3/2010 | Cardona |
| 8,409,875 | B2 | 4/2013 | Johal et al. |
| 8,689,426 | B2 | 4/2014 | Thalmayr |
| 8,987,976 | B2 * | 3/2015 | Zuo .................... H03H 9/02062 310/317 |
| 9,922,809 | B2 | 3/2018 | McCarron et al. |
| 9,941,857 | B1 | 4/2018 | Olsson |
| 10,063,210 | B2 | 8/2018 | McCarron et al. |
| 10,541,662 | B2 | 1/2020 | McCarron et al. |
| 10,541,663 | B2 | 1/2020 | McCarron et al. |
| 10,574,204 | B2 | 2/2020 | McCarron et al. |
| 10,797,681 | B1 | 10/2020 | Hurwitz |
| 2002/0119657 | A1 | 8/2002 | Gandikota et al. |
| 2002/0190814 | A1 | 12/2002 | Yamada |
| 2003/0159919 | A1 | 8/2003 | Fairbairn et al. |
| 2004/0007940 | A1 | 1/2004 | Tsai |
| 2004/0216992 | A1 | 11/2004 | Ando et al. |
| 2005/0006984 | A1 | 1/2005 | Komuro et al. |
| 2005/0145477 | A1 | 7/2005 | Kaas et al. |
| 2005/0194545 | A1 | 9/2005 | Lee et al. |
| 2008/0197750 | A1 | 8/2008 | Katardjiev et al. |
| 2008/0241520 | A1 | 10/2008 | Takahashi |
| 2008/0247264 | A1 | 10/2008 | Gabl et al. |
| 2009/0134011 | A1 | 5/2009 | Rohrmann et al. |
| 2009/0178621 | A1 | 7/2009 | Sunil et al. |
| 2009/0246385 | A1 | 10/2009 | Felmetsger et al. |
| 2010/0142098 | A1 | 6/2010 | Hara |
| 2010/0242578 | A1 | 9/2010 | Link |
| 2011/0062016 | A1 | 3/2011 | Araki et al. |
| 2011/0121689 | A1 | 5/2011 | Grannen |
| 2013/0033337 | A1 | 2/2013 | Nishihara et al. |
| 2013/0120080 | A1 | 5/2013 | Park |
| 2014/0130319 | A1 | 5/2014 | Iwamoto |
| 2014/0154697 | A1 | 6/2014 | Johal et al. |
| 2014/0191619 | A1 | 7/2014 | Ito |
| 2016/0099704 | A1 | 4/2016 | Jaakkola |
| 2016/0197593 | A1 | 7/2016 | Hurwitz et al. |
| 2017/0062192 | A1 | 3/2017 | Oota et al. |
| 2017/0110300 | A1 | 4/2017 | McCarron et al. |
| 2017/0111021 | A1 | 4/2017 | McCarron et al. |
| 2017/0111022 | A1 | 4/2017 | McCarron et al. |
| 2017/0111023 | A1 | 4/2017 | McCarron et al. |
| 2017/0111028 | A1 | 4/2017 | McCarron et al. |
| 2017/0168018 | A1 | 6/2017 | Morton et al. |
| 2017/0168026 | A1 | 6/2017 | Morton et al. |
| 2017/0244070 | A1 | 8/2017 | Bangert et al. |
| 2018/0019728 | A1 | 1/2018 | Kaajakari |
| 2018/0155834 | A1 | 6/2018 | Srinivasan et al. |
| 2018/0241374 | A1 | 8/2018 | Ruby |
| 2019/0296710 | A1 | 9/2019 | Deniz et al. |
| 2020/0382092 | A1 | 12/2020 | Li et al. |
| 2022/0376672 | A1 | 11/2022 | Wang |
| 2023/0028925 | A1 | 1/2023 | Kobayashi |

FOREIGN PATENT DOCUMENTS

| | | | |
|---|---|---|---|
| JP | | 08316147 A | 11/1996 |
| JP | | 09-181369 A | 7/1997 |
| JP | | 2004002152 A | 1/2004 |
| JP | | 2004-320759 A | 11/2004 |
| JP | | 2005-033379 A | 2/2005 |
| JP | | 2005-167194 A | 6/2005 |
| JP | | 2005-536879 A | 12/2005 |
| JP | | 2006-217188 A | 8/2006 |
| JP | | 2006-340007 A | 12/2006 |
| JP | | 2007-036829 A | 2/2007 |
| JP | | 2007-181147 A | 7/2007 |
| JP | | 2009-010926 A | 1/2009 |
| JP | | 2010-135669 A | 6/2010 |
| JP | | 2011-015148 A | 1/2011 |
| JP | | 2012-116736 A | 6/2012 |
| JP | | 2013-014806 A | 1/2013 |
| JP | | 2016-195359 A | 11/2016 |
| WO | | 2006003398 A1 | 1/2006 |
| WO | WO 2006/101450 A1 | | 9/2006 |
| WO | WO 2007/085332 A1 | | 8/2007 |
| WO | WO 2012/003994 A1 | | 1/2012 |
| WO | | 2012/043615 A1 | 4/2012 |
| WO | WO 2017/066448 A1 | | 4/2017 |
| WO | WO 2017/066449 A1 | | 4/2017 |
| WO | WO 2017/106489 A3 | | 6/2017 |
| WO | | 2021050828 A1 | 3/2021 |
| WO | | 2022005504 A1 | 1/2022 |

OTHER PUBLICATIONS

International Preliminary Report on Patentability issued Mar. 15, 2022 for International Patent Application No. PCT/US2020/050333, 6 pages.

Sebastian, Chapter 2, "Dielectric materials for wireless communication," in Measurement of Microwave Dielectric Properties and Factors Affecting Them, 2008, pp. 11-47.

International Search Report and Written Opinion mailed Jan. 14, 2021 in International Application No. PCT/US2020/056792, 9 pages.

International Preliminary Report on Patentability mailed Dec. 13, 2022 in International Application No. PCT/US2020/056792, 7 pages.

Non-Final Office Action dated Mar. 28, 2023 from U.S. Appl. No. 17/839,759.

Liu et al., "On-chip temperature-compensated Love mode surface acoustic wave device for gravimetric sensing", Applied Physics Letters,vol. 105, No. 21, Nov. 24, 2014, pp. 213511-1 to 213511-4.

Final Office Action dated Apr. 19, 2018 for U.S. Appl. No. 15/293,091.

Non-Final Office Action dated Aug. 6, 2018 for U.S. Appl. No. 15/293,091.

Extended European Search Report mailed on Jun. 13, 2024 in EP Application No. 20943116.2 (8 pgs).

(56) References Cited

OTHER PUBLICATIONS

Office Action mailed Oct. 1, 2024 in related Japanese Application No. 2022-516116, original and English translation, 8 pages.
U.S. Appl. No. 62/646,208, filed Mar. 21, 2018, Deniz et al.
U.S. Appl. No. 62/646,212, filed Mar. 21, 2018, Deniz et al.
U.S. Appl. No. 62/646,213, filed Mar. 21, 2018, Deniz et al.
U.S. Appl. No. 15/293,063, filed Oct. 13, 2016, McCarron et al.
U.S. Appl. No. 15/293,071, filed Oct. 13, 2016, McCarron et al.
U.S. Appl. No. 15/293,082, filed Oct. 13, 2016, McCarron et al.
U.S. Appl. No. 15/293,091, filed Oct. 13, 2016, McCarron et al.
U.S. Appl. No. 15/293,108, filed Oct. 13, 2016, McCarron et al.
U.S. Appl. No. 15/380,482, filed Dec. 15, 2016, Morton et al.
U.S. Appl. No. 15/380,551, filed Dec. 15, 2016, Morton et al.
U.S. Appl. No. 16/359,632, filed Mar. 20, 2019, Deniz et al.
PCT/US2016/059840, filed Oct. 13, 2016, McCarron et al.
PCT/US2016/056843, filed Oct. 13, 2016, McCarron et al.
PCT/US2016/066913, filed Dec. 15, 2016, Morton et al.
International Patent Application No. PCT/US2016/066913, filed Dec. 15, 2016; International Search Report / Written Opinion issued Jul. 11, 2017; 22 pages.
International Patent Application No. PCT/US2016/066913, filed Dec. 15, 2016; International Preliminary Report on Patentability issued Jun. 28, 2018; 13 pages.
International Patent Application No. PCT/US2016/056840, filed Oct. 13, 2016; International Search Report / Written Opinion issued Jan. 20, 2017; 19 pages.
International Patent Application No. PCT/US2016/056840, filed Oct. 13, 2016; International Preliminary Report on Patentability issued Apr. 26, 2018; 14 pages.
International Patent Application No. PCT/US2016/056843, filed Oct. 13, 2016; International Search Report / Written Opinion issued Jan. 26, 2017; 18 pages.
International Patent Application No. PCT/US2016/056843, filed Oct. 13, 2016; International Preliminary Report on Patentability issued Apr. 26, 2018; 13 pages.
Chapter 2, Ferrari et al., "Overview of Acoustic-Wave Microsensors," in *Piezoelectric Transducers and Applications*. Vives (Ed.), Springer-Verlag Berling Heidelberg; 2008. Table of Contents and pp. 39-62.
Chapter 22, Yanagitani, "Shear Mode Piezoelectric Thin Film Resonators," in *Acoustic Waves—From Microdevices to Helioseismology*. Beghi (Ed.), InTech;Nov. 14, 2011. pp. 501-520.
Author Unknown, "Understanding Planar Magnetrons for PVD Coatings," Semicore Equipment, Inc., May 14, 2013, 4 pages, www.azonano.com/article.aspx?ArticleID=3454.
Bjurström, Johan, "Advanced Thin Film Electroacoustic Devices," Digital Comprehensive Summaries of Uppsala Dissertations from the Faculty of Science and Technology, 280, ISSN 1651-6214, 2007, 86 pages.
Bjurström, et al., "Design and Fabrication of Temperature Compensated Liquid FBAR Sensors," *2006 IEEE Ultrasonics Symposium*, Oct. 2-6, 2006, pp. 894-897.
Bjurström, et al., "Synthesis of Textured Thin Piezoelectric AlN Films With a Nonzero C-Axis Mean Tilt for the Fabrication of Shear Mode Resonators," IEEE Transactions on Ultrasonics, Ferroelectrics, and Frequency Control, vol. 53, No. 11, Nov. 2006, pp. 2095-2100.
Chang et al., "The influence of Mg doped ZnO thin films on the properties of Love wave sensors," May 28, 2008, *Sensors and Actuators B*, 132(1):290-295.
Chen et al., "Characteristics of Dual Mode AlN Thin Film Bulk Acoustic Wave Resonators," IEEE International Frequency Control Symposium [online]. May 19-21, 2008, published in: May 2008, *IEEE*, 609-14.
Chen et al., "The Liquid Sensor Using Thin Film Bulk Acoustic Resonator with C-Axis Tilted AlN Films," 2013, *Journal of Nanomaterials*, 2013:8.
Chen et al., "Temperature stability of ZnO-based Love wave biosensor with SiO2 buffer layer," Dec. 1, 2009, *Sensors and Actuators A*, 156(2):317-22.

Connolly, "Diffraction Basics, Part 2," Spring 2012, *EPS400-002, Introduction to X-Ray Powder Diffraction*, 12 pages.
Corso, et al., "Development of a Simple Inexpensive Bulk Acoustic Wave (BAW) Nanosensor for Cancer Biomarkers: Detection on Secreted Sonic Hedgehog from Prostate Cancer Cells", Abstract #8866, Winship Cancer Institute, Emory University, Georgia Institute of Technology, Oct. 2012, 1 page.
Demiguel-Ramos, M. et al., "Induced Surface Roughness to Promote the Growth of Tilted-AlN Films for Shear Mode Resonators," 2013 Joint UFFC, EFTF and PFM Symposium Proceedings, 2013, IEEE, pp. 274-277.
Depla et al. "Sputter Deposition Process," 2010. *Handbook of Deposition Technologies for Films and Coatings: Science, Applications and Technology*, 253-96.
Fardeheb-Mammeri, A. et al., "Growth and characterization of c-axis included AlN films for shear wave devices," Semiconductor Science and Technology, vol. 23, Aug. 12, 2008, 7 pages.
Fardeheb-Mammeri, A. et al., "Growth of inclined c-axis AlN films in planar system for BAW devices," Journal of Electron Devices, vol. 5, 2007, pp. 132-137.
García-Gancedo, L. et al., "AlN-based BAW resonators with CNT electrodes for gravimetric biosensing," Sensors and Actuators B: Chemical, vol. 160, No. 1, Dec. 15, 2011, pp. 1386-1393.
García-Gancedo, L. et al., "Dual-Mode Thin Film Bulk Acoustic Wave Resonators for Parallel Sensing of Temperature and Mass Loading," Biosensors and Bioelectronics, vol. 38, No. 1, Oct.-Dec. 2012, pp. 369-374.
Iriarte, Gonzalo F. et al., "Synthesis of C-Axis-Oriented AlN Thin Films on High-Conducting Layers: Al, Mo, Ti, TiN, and Ni," IEEE Transactions on Ultrasonics, Ferroelectrics, and Frequency Control, vol. 52, No. 7, Jul. 2005, pp. 1170-1174.
Jamneala et al. "Modified Mason Model for Bulk Acoustic Wave Resonators," Sep. 2008, *IEEE Transactions on Ultrasonics, Ferroelectrics, and Frequency Control*, 55(9):2025-29.
Kobayashi, "X-ray thin film measurement techniques: IV. In-plan XRD measurements," 2010, *The Rigaku Journal*, 26(1):3-11.
Koskenvuori et al., "Temperature Measurement and Compensation Based on Two Vibrating Modes of a Bulk Acoustic Mode Microresonator," *MEMS 2008*, Tucson, Arizona, Jan. 13-17, 2008, pp. 78-81.
Lakin, "Modeling of Thin Film Resonators and Filters," 1992, *IEEE MTT-S Microwave Symposium Digest*, pp. 149-152.
Lee et al., "Microfluidic Mixing: A Review," May 18, 2011, *International Journal of Molecular Sciences*, 12:3263-87.
Link, Mathias, "Study and realization of shear wave mode solidly mounted film bulk acoustic resonators (FBAR) made of c-axis inclined zinc oxide (ZnO) thin films: application as gravimetric sensors in liquid environments," Université Henri Poincaré—Nancy I, Thesis, Sep. 14, 2006, 225 pages.
Milyutin, Evgeny, "Theoretical and Experimental Study of Piezoelectric Modulated AlN Thin Films for Shear Mode BAW Resonators," EPFL, Thesis No. 5113, Nov. 4, 2011, 109 pages.
Montagut, Yeison et al. "QCM Technology in Biosensors," Biosensors—Emerging Materials and Applications, Chapter 9, 2011, INTECH Open Access Publisher, pp. 153-178.
Moreira et al., "Synthesis of c-tilted AlN films with a good tilt and thickness uniformity," 2011 IEEE International Ultrasonics Symposium Proceedings, 2011, pp. 1238-1241.
Moreira, "Synthesis of Thin Piezoelectric AlN Films in View of Sensors and Telecom Applications," 2014, *Digital Comprehensive Summaries of Uppsala Dissertations from the Faculty of Science and Technology 1160*, ISSN 1651-6214, 84 pages.
Munir, "A Fast, Scalable Acoustic Resonator-Based Biosensor Array System for Simultaneous Detection of Multiple Biomarkers", Thesis, Georgia Institute of Technology, Dec. 2012, 160 pages.
Nirschl et al., "CMOS-Integrated Film Bulk Acoustic Resonators for Label-Free Biosensing," Sensors, vol. 10, No. 5, Apr. 27, 2010, pp. 4180-4193.
Petit, D., et al., "Temperature Compensated BAW Resonator and Its Integrated Thermistor for a 2.5 GHz Electrically Thermally Compensated Oscillator," IEEE Radio Frequency Integrated Circuits Symposium, Jun. 7-9, 2009, pp. 339-342.

(56) References Cited

OTHER PUBLICATIONS

Pierce, D.E., et al., "A Temperature Insensitive Quartz Microbalance," IEEE Transactions on Ultrasonics, Ferroelectrics, and Frequency Control, vol. 45, No. 5, Sep. 1998, pp. 1238-1245.

Qin et al., "Analytical Study of Dual-Mode Thin Film Bulk Acoustic Resonators (FBARs) Based on ZnO and AIN Films with Tilted c-Axis Orientation," Aug. 2010, *IEEE Trans. UFFC*, 57(8):1840-53.

Qorvo US, Inc. "Summary of Sales Activity of Predecessor to Applicant Concerning Tilted C-Axis Aluminum Nitride Products," Unpublished, Jan. 10, 2017, 1 page.

Rabus et al., "A high sensitivity open loop electronics for gravimetric acoustic wave-based sensors," Jun. 2013, *IEEE Transactions on Ultrasonics, Ferroelectrics, and Frequency Control*, 60(6):1219-1226.

Smith, J. H., et al., "Self-Consistent Temperature Compensation for Resonant Sensor with Application to Quartz Bulk Acoustic Wave Chemical Sensors," 8th International Conference on Solid-State Sensors and Actuators, 1995, and Eurosensors IX, Transducers '95, vol. 2, Jun. 25-29, 1995, pp. 724-727.

Stan, et al., "Tilt c Axis Crystallite Growth of Aluminium Nitride Films by Reactive RF-Magnetron Sputtering," Mar. 2012, *Digest Journal of Nanomaterials and Biostructures*, 7(1):41-50.

Suzuki, Masashi et al., "C-axis parallel oriented AIN film resonator fabricated by ion-beam assisted RF magnetron sputtering," 2011 IEEE International Ultrasonics Symposium Proceedings, 2011, pp. 1230-1233.

Thornton, "Influence of apparatus geometry and deposition conditions on the structure and topography of thick sputtered coatings," 1974, *J. Vac. Sci. Technology*, A 11:666.

Waite, Matthew M. et al., "Sputtering Sources," 50 Years of Vacuum Coating Technology and the growth of the Society of Vacuum Coaters, Chapter 15, 2007, Society of Vacuum Coaters, Spring Bulletin, 2010, pp. 42-50.

Wang, J.S. et al., "Sputtered C-Axis Inclined Piezoelectric Films and Shear Wave Resonators," IEEE 37th Annual Symposium on Frequency Control, 1983, IEEE, pp. 144-150.

Yanagitani, T. et al., "Pure-shear mode BAW resonators consisting of (11-20) textured ZnO films," Acoustics 08 Paris, 2008, pp. 4987-4992.

Ye, et al. "Photoreactivity of Alkysiloxane Self-Assembled Monolayers on Silicon Oxide Surfaces," Langmuir, vol. 17, No. 15, Jun. 21, 2001, pp. 4497-4500.

Yu, et al., "Ultra Temperature-Stable Bulk-Acoustic-Wave Resonators with $SiO_2$ Compensation Layer," IEEE Transactions on Ultrasonics, Ferroelectrics, and Frequency Control, vol. 54, No. 10, Oct. 2007, pp. 2102-2109.

Zhang, X et al. "Excimer laser ablation of thin gold films on quartz crustal microbalance at various argon background pressures," Applied Physics A, vol. 64, No. 6, Jun. 1997 pp. 545-552.

Zhou, Yan et al. "Interfacial Structures and Properties of Organize Materials for Biosensors: An Overview," Sensors, vol. 12 Nov. 6, 2012, pp. 15039-15062.

Mathias Link. Study and realization of shear wave mode solidly mounted film bulk acoustic resonators (FBAR) made of e-axis inclined zinc oxide (ZnO) thin films: application as gravimetric sensors in liquid environments. Mechanics.jphysics.med-phj. Universite Henri Poincare—Nancy I, 2006. (Year: 2006).

Office Action dated Oct. 9, 2020 from U.S. Appl. No. 16/359,575, 15 pages.

Extended European Search Report dated Sep. 21, 2023 from Application No. EP 20 86 3361, 11 pages.

Deng et al., "Biaxial texture developments in aluminum nitride layers during off-axis sputter deposition," Journal of Vacuum Science, vol. 30, No. 5, Sep.-Oct. 2012, pp. 051501-01-051501-9, 9 pages.

* cited by examiner

100
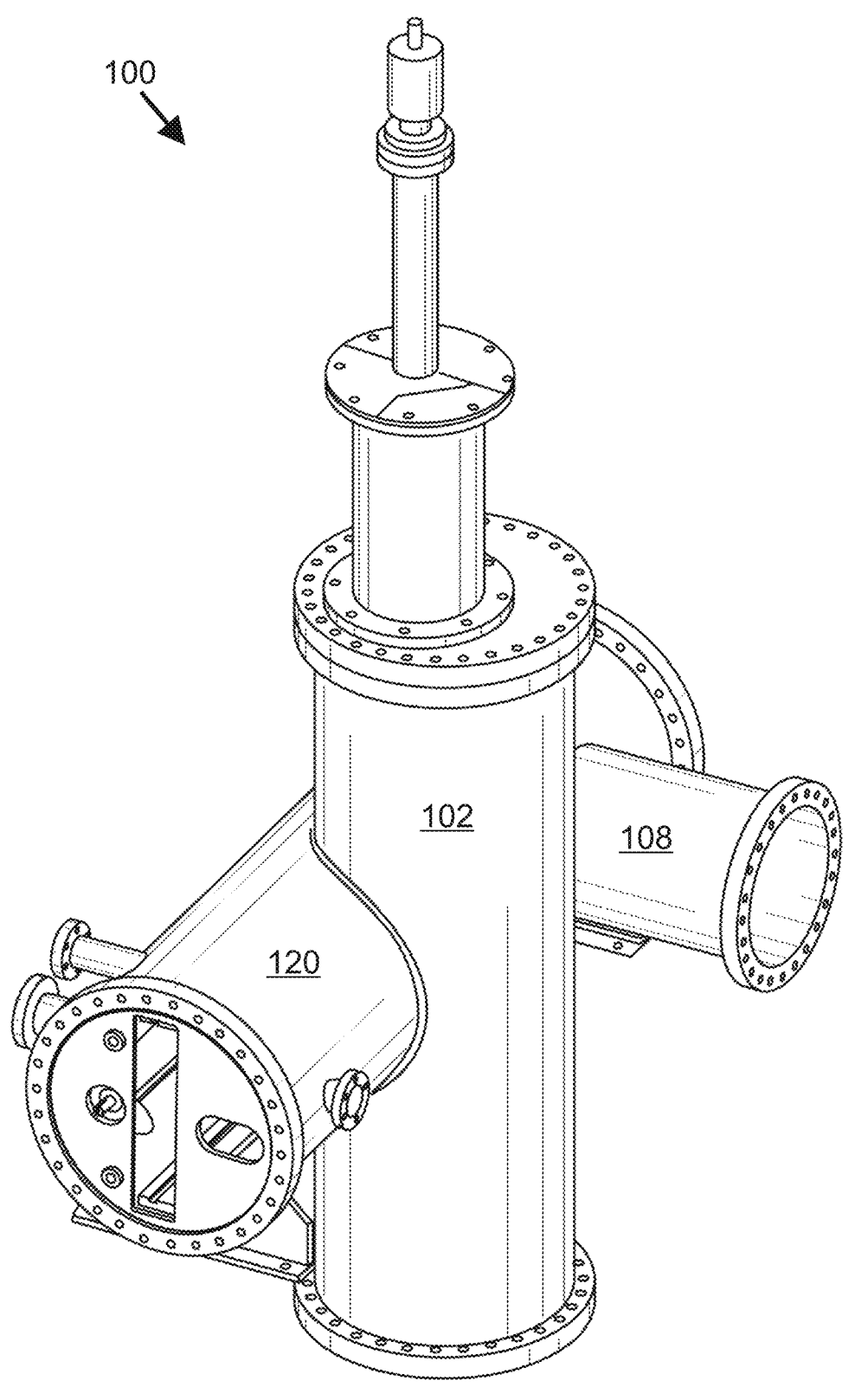
102
108
120
*FIG. 7          Prior Art*

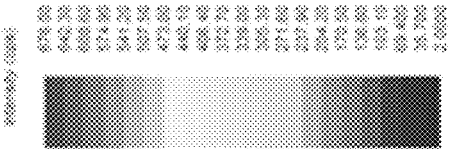
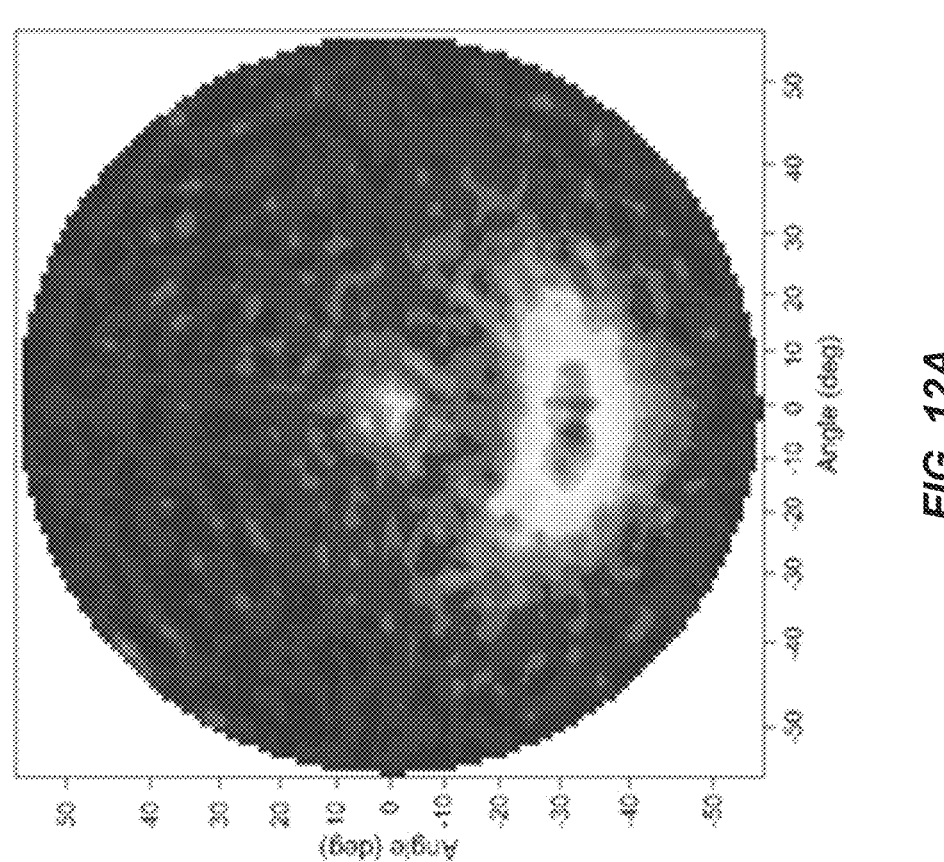
FIG. 12A

PIEZOELECTRIC BULK LAYERS WITH TILTED C-AXIS ORIENTATION AND METHODS FOR MAKING THE SAME

CROSS-REFERENCE TO RELATED APPLICATIONS

This application is a continuation of U.S. patent application Ser. No. 16/359,575, filed Mar. 20, 2019, which claims the benefit of U.S. Provisional Application No. 62/646,212, filed Mar. 21, 2018, the disclosures of which are incorporated by reference herein in their entirety.

FIELD

The present disclosure relates to structures including inclined c-axis hexagonal crystal structure piezoelectric materials such as aluminum nitride (AlN) and zinc oxide (ZnO), as well as systems and methods for producing inclined c-axis hexagonal crystal structure piezoelectric material. Inclined c-axis hexagonal crystal structure piezoelectric materials may be used, for example, in various resonators as well as in thin film electroacoustic and/or sensor devices, particularly for sensors operating in liquid/viscous media (e.g., chemical and biochemical sensors), and the like.

BACKGROUND

Hexagonal crystal structure piezoelectric materials such as AlN and ZnO are of commercial interest due to their piezoelectric and electroacoustic properties. Beneficial properties in this regard include a high mechanical quality factor, moderate coupling coefficient, moderate piezoelectric constant, high acoustic velocity, and low propagation losses. In addition to these characteristics, AlN thin films are chemically stable and compatible with various integrated circuit fabrication technologies, thereby making AlN an attractive material for fabrication of electroacoustic devices, including bulk acoustic wave (BAW) devices such as band-pass filters and the like.

A primary use of electroacoustic technology has been in the telecommunication field (e.g., for oscillators, filters, delay lines, etc.). More recently, there has been a growing interest in using electroacoustic devices in high frequency sensing applications due to the potential for high sensitivity, resolution, and reliability. However, it is not trivial to apply electroacoustic technology in certain sensor applications—particularly sensors operating in liquid or viscous media (e.g., chemical and biochemical sensors)—since longitudi-nal and surface waves exhibit considerable acoustic leakage into such media, thereby resulting in reduced resolution.

In the case of a piezoelectric crystal resonator, an acoustic wave may embody either a bulk acoustic wave (BAW) propagating through the interior (or 'bulk') of a piezoelectric material, or a surface acoustic wave (SAW) propagating on the surface of the piezoelectric material. SAW devices involve transduction of acoustic waves (commonly including two-dimensional Rayleigh waves) utilizing interdigital transducers along the surface of a piezoelectric material, with the waves being confined to a penetration depth of about one wavelength. BAW devices typically involve trans-duction of an acoustic wave using electrodes arranged on opposing top and bottom surfaces of a piezoelectric mate-rial. In a BAW device, different vibration modes can propa-gate in the bulk material, including a longitudinal mode and two differently polarized shear modes, wherein the longitudinal and shear bulk modes propagate at different velocities. The longitudinal mode is characterized by compression and elongation in the direction of the propagation, whereas the shear modes consist of motion perpendicular to the direction of propagation with no local change of volume. The propa-gation characteristics of these bulk modes depend on the material properties and propagation direction respective to the crystal axis orientations. Because shear waves exhibit a very low penetration depth into a liquid, a device with pure or predominant shear modes can operate in liquids without significant radiation losses (in contrast with longitudinal waves, which can be radiated in liquid and exhibit signifi-cant propagation losses). Restated, shear mode vibrations are beneficial for operation of acoustic wave devices with fluids because shear waves do not impart significant energy into fluids.

Certain piezoelectric thin films are capable of exciting both longitudinal and shear mode resonance. To excite a wave including a shear mode using a standard sandwiched electrode configuration device, a polarization axis in a piezoelectric thin film must generally be non-perpendicular to (e.g., tilted relative to) the film plane. Hexagonal crystal structure piezoelectric materials such as (but not limited to) aluminum nitride (AlN) and zinc oxide (ZnO) tend to develop their polarization axis (i.e., c-axis) perpendicular to the film plane, since the (0001) plane typically has the lowest surface density and is thermodynamically preferred. Certain high-temperature (e.g., vapor phase epitaxy) pro-cesses may be used to grow tilted c-axis films, but providing full compatibility with microelectronic structures such as metal electrodes or traces requires a low temperature depo-sition process (e.g., typically below about 300° C.).

Low temperature deposition methods such as reactive radio frequency magnetron sputtering have been used for preparing tilted AlN films having angles that vary signifi-cantly with position over the area of a substrate. FIG. 1 is a simplified schematic of an axial sputtering deposition appa-ratus arranged to eject metal atoms from a target 2 (adjacent to a cathode (not shown)) toward a substrate 4 supported by a substrate holder 6 that is substantially parallel to the target 2 in a reactive gas-containing environment. The target 2 and the substrate 4 are aligned with one another and share a single central axis 8; however, a typical geometry of sput-tering deposition results in a cosine distribution 10 of piezoelectric material molecules (e.g., AlN molecules cre-ated by metal atoms reacting with nitrogen in the sputtering gas) being received by the substrate 4. This phenomenon leads to a c-axis direction of the deposited piezoelectric material that varies with radial position, from an angle of zero (corresponding to a vertical c-axis) at the center of the substrate 4, to a c-axis direction with a tilt angle that increases with distance from the center.

The above-described variation with radial position of c-axis direction of a deposited piezoelectric material is disclosed by Stan, G. E., et al., "Tilt c Axis Crystallite Growth of Aluminium Nitride Films by Reactive RF-Mag-netron Sputtering," Digest Journal of Nanomaterials and Biostructures, vol. 7, no. 1, pp. 41-50 (2012) (hereinafter, "Stan"). FIG. 2A is a schematic representation (reproduced from Stan) of a rocking curve measurement geometry of an AlN film structure obtained by radio frequency magnetron sputtering in a reactive gas environment in an axially aligned planar sputtering system without tilting a 50 mm Si sub-strate. FIG. 2A shows that the AlN film structure according to Stan exhibits zero c-axis tilt angle at the center, and a radially symmetrical variation of tilt angle of crystallites in the AlN film structure, analogous to a circular "race track"

with banked walls. FIG. 2B is a plot of tilt angle versus distance from center (also derived from Stan) for the AlN film structure described in connection with FIG. 2A, showing a nearly linear variation of tilt angle with increasing distance away from a center of the AlN film structure, to a maximum tilt angle of about 6.5 degrees near the margins of the 50 mm wafer. One effect of the lack of uniformity of c-axis tilt angle of the AlN film structure over the substrate is that if the AlN film-covered substrate were to be diced into individual chips, the individual chips would exhibit significant variation in c-axis tilt angle and concomitant variation in acoustic wave propagation characteristics. Such variation in c-axis tilt angle would render it difficult to efficiently produce large numbers of resonator chips with consistent and repeatable performance. Moreover, use of a target surface axially aligned with a substrate holder that is parallel to the target surface enables attainment of only a limited range of c-axis tilt angles, as evidenced by the 0-6.5 degree tilt angle range shown in FIG. 2B.

Before describing other techniques for preparing tilted AlN films, desirable regimes for c-axis tilt angle (or angle of inclination) will be discussed. An electromechanical coupling coefficient is a numerical value that represents the efficiency of piezoelectric materials in converting electrical energy into acoustic energy for a given acoustic mode. Changing the c-axis angle of inclination for hexagonal crystal structure piezoelectric materials causes variation in shear and longitudinal coupling coefficients, as shown in FIG. 3. FIG. 3 embodies plots of shear coupling coefficient ($K_s$) and longitudinal coupling coefficient ($K_l$) each as a function of c-axis angle of inclination for AlN. It can be seen that a maximum electromechanical coupling coefficient of shear mode resonance in AlN is obtained at a c-axis angle of inclination of about 35 degrees, that a pure shear response (with zero longitudinal coupling) is obtained at a c-axis angle of inclination of about 46 degrees, and that the shear coupling coefficient exceeds the longitudinal coupling coefficient for c-axis angle of inclination values in a range of from about 19 degrees to about 63 degrees. The longitudinal coupling coefficient is also zero at a c-axis angle of inclination of 90 degrees, but it is impractical to grow AlN at very steep c-axis inclination angles. Similar behavior is expected for other piezoelectric materials, although the specific angle positions may vary. For electroacoustic resonators intended to operate in liquids or other viscous media, it would be desirable to provide piezoelectric films with a c-axis tilt angle sufficient to provide a shear coupling coefficient that exceeds a longitudinal coupling coefficient—in certain embodiments, at a c-axis tilt angle in which the longitudinal coupling coefficient approaches zero, or at a c-axis-tilt angle at or near a value where shear coupling is maximized. Thus, for an electroacoustic resonator including an AlN piezoelectric layer, it would be desirable to provide a c-axis tilt angle in a range of from about 19 degrees to about 63 degrees, and particularly desirable to provide a c-axis tilt angle between 35 and 46 degrees. Other c-axis tilt angles may be desirable for other purposes or when materials other than AlN are used for deposition.

Various low temperature deposition methods that have been devised for growing AlN films at c-axis tilt angles greater than those attainable with the axial sputtering apparatus of FIG. 1 are described in connection with FIGS. 4A-4C. FIG. 4A (which is adapted from Moreira, Milena De Albuquerque, "Synthesis of Thin Piezoelectric AlN Films in View of Sensors and Telecom Applications," 2014, Digital Comprehensive Summaries of Uppsala Dissertations from the Faculty of Science and Technology, 1651-6214; 1160)

(hereinafter, "Moreira") is a simplified schematic of an off-axis sputtering deposition apparatus arranged to eject metal atoms from a target surface 12 toward a substrate 14 supported by a substrate holder 16 that is substantially parallel to the target surface 12, with central axes of the substrate 14 and the target surface 12 being parallel but offset relative to one another, with an angle θ representing an angle between a central axis 18 of the target surface 12 and a center of the substrate 14. A distribution 20 of piezoelectric material molecules created by reaction of metal atoms and gas is received by the substrate 14, resulting in a tilted c-axis direction of deposited piezoelectric material (including tilted 'columns' of piezoelectric material with a preferential growth direction due to alignment with the tilted flux), with the c-axis tilt angle of the piezoelectric material varying with respect to position along the substrate 14. In particular, a portion of the deposited piezoelectric material that is closer to the central axis 18 of the target surface 12 will exhibit a c-axis tilt angle that is shallower than a portion of the piezoelectric material that is farther from the central axis 18 of the target surface 12. Due to the lateral offset of the substrate 14 relative to the central axis 18 of the target surface 12, the off-axis sputtering deposition apparatus of FIG. 4A is capable of attaining piezoelectric films with c-axis tilt angles that are larger than those attainable with the apparatus of FIG. 1.

Additional low temperature deposition sputtering apparatuses capable of growing piezoelectric films with even larger c-axis tilt angles are described in connection with FIGS. 4B and 4C (which are also adapted from Moreira). FIG. 4B is a simplified schematic of a sputtering deposition apparatus arranged to eject metal atoms from a target surface 22 toward a substrate 24 supported by a substrate holder 26 that is non-parallel to the target surface 22 (i.e., wherein the substrate holder 26 is tilted by an angle θ relative to a plane parallel with the target surface 22), wherein a central axis 28 of the target surface 22 extends through a center point of the substrate 24. A distribution 30 of piezoelectric material molecules created by reaction of metal atoms and gas is received by the substrate 24, resulting in a tilted c-axis direction of deposited piezoelectric material (including tilted 'columns' of piezoelectric material with a preferential growth direction due to alignment with the tilted flux), with the c-axis tilt angle of the piezoelectric material varying with respect to position along the substrate 24. FIG. 4C is a simplified schematic of a sputtering deposition apparatus arranged to eject metal atoms from a target surface 32 toward a substrate 34 supported by a substrate holder 36 that is non-parallel to the target surface 32. A central axis 38B of the substrate 34 extends through a center point of the target surface 32, with a central axis 38A of the target surface 32 being separated from the central axis 38B of the substrate 34 by a first angle $θ_1$, and with substrate holder 36 being tilted by a second angle $θ_2$ relative to a plane parallel with the target surface 32. A distribution 40 of piezoelectric material molecules created by reaction of metal atoms and gas is received by the substrate 34, resulting in a tilted c-axis direction of deposited piezoelectric material (including tilted 'columns' of piezoelectric material with a preferential growth direction due to alignment with the tilted flux), with the c-axis tilt angle of the piezoelectric material varying with respect to position along the substrate 34.

Yet another method for growing a tilted c-axis AlN film involves two-step sputtering deposition as described by Moreira, including first step growth of an initial, non-textured seed layer at a relatively high process pressure while keeping the substrate at room temperature, followed by second step growth of a film at a lower process pressure and an elevated substrate temperature. FIG. 5A is a cross-sectional schematic view of a seed layer 44 exhibiting multiple textures deposited via the first sputtering step over a substrate 42, and FIG. 5B is a similar view of the seed layer 44 and substrate 42 of FIG. 5A following deposition via a second sputtering step of a tilted axis AlN film 46 bulk layer over the seed layer 44. As described by Moreira, the seed layer exhibits different textures, most notably (103) and (002). The high pressure used during seed layer deposition promotes the (103) texture, and typically results in a seed layer with no in-plane alignment along the (002) direction.

When a bulk layer is deposited, the pressure is decreased to actually promote the evolution of (002) texture. The seed layer grains with (002) orientations facing the incoming flux during an off-normal incidence deposition will provide crystallographic templates such that the resultant bulk layer will have tilted (002) texture. The low pressure deposition in combination with a small distance between the target and substrate yields a directional deposition flux that results in competitive column growth. During off-normal incidence deposition, (002) grains grow taller than other grains due to shadowing effects and surface atom mobility differences. Adatoms on (002) grains are slower than those on other grains (e.g., on non-tilted (002) grains, or tilted or non-tilted (103) grains). Because the mobilities of adatoms on (002) grains are slower, they have higher "sticking coefficients" than the faster adatoms on other grains, which results in a higher vertical growth of the (002) grains. As (002) grains get taller they shadow neighboring grains due to incoming flux coming from an angle, thereby further limiting growth of such neighboring grains. Competitive column growth results in a film with a c-axis lying in the plane of the deposition flux at any given point along the substrate. As noted by Moreira, even though there is no intentional tilt of the flux, the magnetron disposition at the target surface generates a "race track", which in turn provides the tilted flux direction towards the substrate. Such a "race track" described by Moreira is understood to correspond to a radially symmetric variation of tilt angle of crystallites in the film structure, similar to that described hereinabove in connection with FIGS. 2A and 2B.

Each of the foregoing apparatuses and tilted piezoelectric material growth methods are understood to produce film-covered substrates exhibiting significant variation in c-axis tilt angle with respect to position on the substrate. As noted previously, one effect of a lack of uniformity of c-axis tilt angle of a piezoelectric film arranged on the substrate is that if the film-covered substrate were to be diced into individual chips, then the individual chips would exhibit significant variation in c-axis tilt angle and concomitant variation in acoustic wave propagation characteristics. Such variation in c-axis tilt angle would render it difficult to efficiently produce large numbers of resonator chips with consistent and repeatable performance.

Improved methods and systems for producing bulk films with c-axis tilt have been described, where the c-axis tilt of the bulk layer is primarily controlled by controlling the deposition angle. For example, a device and method for depositing seed and bulk layers with a tilted c-axis are described in U.S. patent application Ser. No. 15/293,063 entitled "Deposition System for Growth of Inclined C-Axis Piezoelectric Material Structures;" U.S. patent application Ser. No. 15/293,071 entitled "Methods for Fabricating Acoustic Structure with Inclined C-Axis Piezoelectric Bulk and Crystalline Seed Layers;" U.S. patent application Ser. No. 15/293,082 entitled "Acoustic Resonator Structure with Inclined C-Axis Piezoelectric Bulk and Crystalline Seed Layers;" U.S. patent application Ser. No. 15/293,091 entitled "Multi-Stage Deposition System for Growth of Inclined C-Axis Piezoelectric Material Structures;" and U.S. patent application Ser. No. 15/293,108 entitled "Methods for Producing Piezoelectric Bulk and Crystalline Seed Layers of Different C-Axis Orientation Distributions".

These patent publications also describe attempts to deposit a bulk layer directly onto a substrate without first depositing a seed layer (see, for example, U.S. patent application Ser. No. 15/293,071). However, such bulk layers, deposited under the same conditions as used for bulk layers deposited onto seed layers, failed to exhibit a desired minimum shear mode to longitudinal coupling ratio of at least 1.25. In other words, the resulting structures would not be useful for bulk acoustic sensing resonators in liquid/viscous media, which was one of the intended functions of these published patent applications. When the bulk layer was deposited onto a seed layer that was deposited at 5 mTorr, the resulting films exhibited insufficient shear mode coupling. When the bulk layer was deposited onto a seed layer that was deposited at 15 mTorr, the resulting films exceeded the desired minimum ratio of 1.25 and thus would be useful for bulk acoustic resonators in liquid/viscous environments.

Further improvements are desired to provide, for example, one or more of: additional control over the angle of the c-axis of crystals in bulk layers; improved characteristics such as mechanical quality factor, coupling coefficient, or shear to longitudinal coupling ratio; and improved manufacturing efficiency of bulk layers.

SUMMARY

The present disclosure provides bulk acoustic wave resonator structures and methods for fabricating such resonator structures. The bulk acoustic wave resonator structures include a bulk layer with inclined c-axis hexagonal crystal structure piezoelectric material. The hexagonal crystal structure piezoelectric material bulk layer is supported by a substrate. The bulk layer may be prepared without first depositing a seed layer on the substrate. The bulk layer is prepared such that the c-axis orientation of the crystals in the bulk layer is selectable within a range of about 0 degrees to about 90 degrees, such as from about 30 degrees to about 52 degrees, or from about 35 degrees to about 46 degrees. The c-axis orientation distribution is preferably substantially uniform over the area of a large substrate (e.g., having a diameter in a range of at least about 50 mm, about 100 mm, or about 150 mm), thereby enabling multiple chips to be derived from a single substrate and having the same or similar acoustic wave propagation characteristics.

A method for preparing a crystalline bulk layer having a c-axis tilt includes depositing a bulk material layer directly onto a substrate at an off-normal incidence under deposition conditions comprising a pressure of less than 5 mTorr. The bulk material layer may be deposited at a deposition angle of about 35 degrees to about 85 degrees.

A method for preparing a crystalline bulk layer having a c-axis tilt includes depositing a bulk material layer directly onto a substrate at an off-normal incidence, where the bulk material layer has a thickness of about 1,000 Angstroms to about 30,000 Angstroms. The bulk material layer may be deposited at a deposition angle of about 35 degrees to about 85 degrees. The bulk material may exhibit a ratio of shear coupling to longitudinal coupling of 1.25 or greater during excitation.

A structure includes a substrate comprising a wafer and a piezoelectric bulk material layer deposited onto a surface of the wafer, where the bulk material layer has a c-axis tilt of about 32 degrees or greater. The structure may exhibit a ratio of shear coupling to longitudinal coupling of 1.25 or greater during excitation.

A bulk acoustic wave resonator includes a structure including a substrate comprising a wafer and a piezoelectric bulk material layer deposited onto a surface of the wafer, where the bulk material layer has a c-axis tilt of about 32 degrees or greater, where at least a portion of piezoelectric bulk material layer is between the first electrode and the second electrode.

A method for preparing a crystalline bulk layer having a c-axis tilt with a preselected angle includes depositing a bulk material layer onto a substrate at an off-normal incidence under initial conditions that retard surface mobility of the material being deposited such that crystals in the bulk material layer are substantially parallel to one another and are substantially oriented in a direction of the preselected angle.

BRIEF DESCRIPTION OF DRAWINGS

FIG. 7 is an upper exterior perspective view of a reactor of a deposition system for growing a hexagonal crystal structure piezoelectric material with an inclined c-axis, the system including a linear sputtering apparatus, a movable substrate table for supporting multiple substrates, and a collimator.

FIGS. 12A and 12B are graphical representations of the c-axis angle of a comparative sample from the Example.

DETAILED DESCRIPTION

The present disclosure relates to methods of depositing crystalline bulk layers that allow for selecting the c-axis tilt. In particular, the present disclosure relates to methods of depositing crystalline bulk layers that allow for selecting c-axis tilt angles that are greater than angles achieved with prior art methods (e.g., greater than about 28 to 30 degrees for AlN). The methods of the present disclosure may result in bulk layers where the crystals of the bulk layer are substantially oriented with one another.

The present disclosure also relates to methods of depositing crystalline bulk layers at an inclined c-axis directly on a substrate without a seed layer.

One or both of achieving a desired c-axis tilt and directly depositing a piezoelectric bulk layer on a substrate (without an intervening seed layer) may result in improved characteristics of the resulting structure, such as improved coupling efficiency, improved mechanical quality factor, and improved shear to longitudinal coupling ratios.

When referring to c-axis tilt or c-axis orientation, it should be understood that even if a single angular value is given, the crystals in a deposited crystal layer (e.g., a seed layer or a bulk layer) may exhibit a distribution of angles. The distribution of angles typically approximately follows a normal (e.g., Gaussian) distribution that can be graphically demonstrated, for example, as a two-dimensional plot resembling a bell-curve, or by a pole figure.

Figure 1:
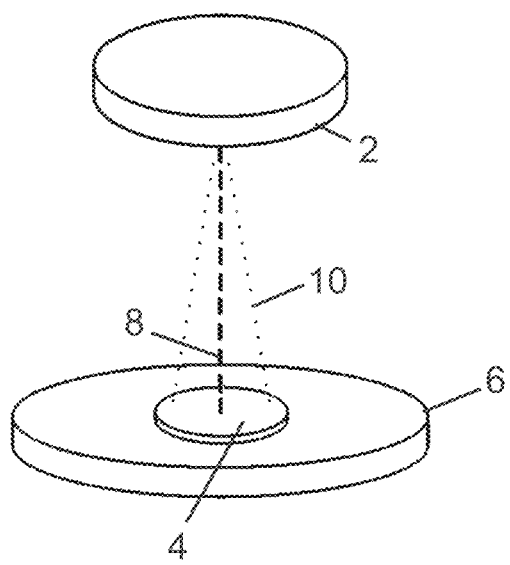
FIG. 1 is a simplified schematic of an axial sputtering deposition apparatus arranged to eject metal atoms from a target surface toward a substrate supported by a substrate holder substantially parallel to the target surface, with central axes of the target surface and the substrate being aligned with one another.
Figure 3:
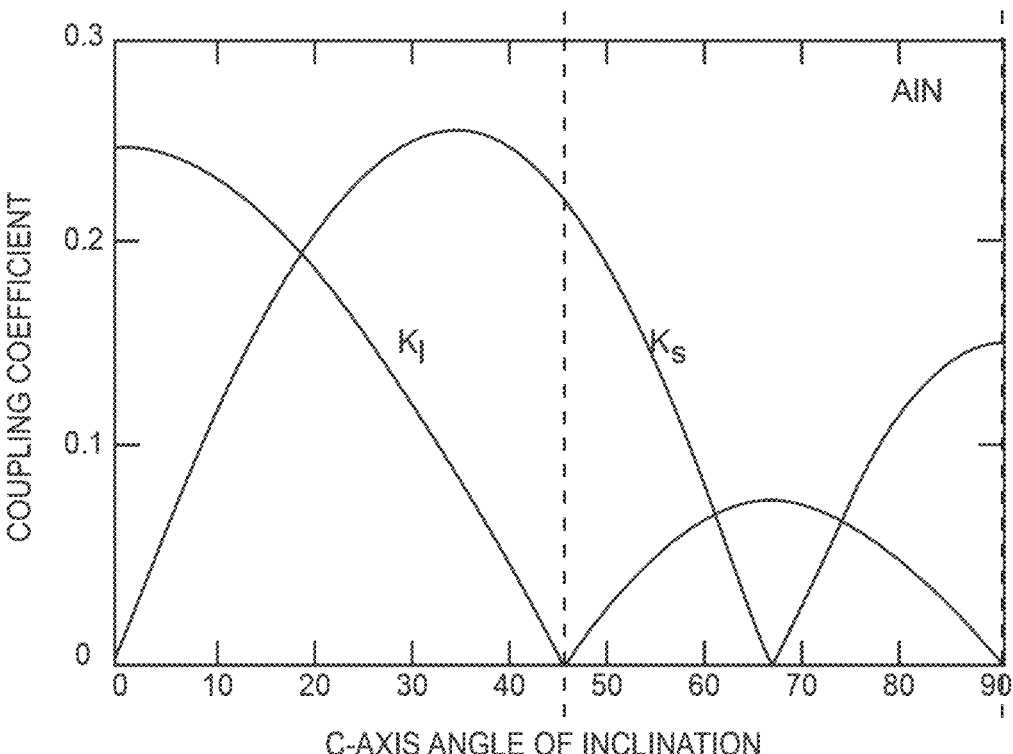
FIG. 3 is a plot of shear coupling coefficient (Ks) and longitudinal coupling coefficient (Kl) as a function of c-axis angle of inclination for AlN.
Figure 2A:
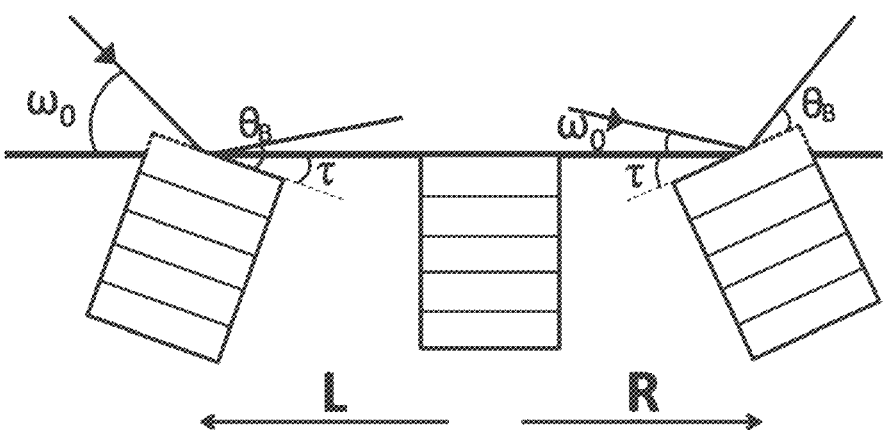
FIG. 2A is a schematic representation of a rocking curve measurement geometry of an AlN film structure obtained by radio frequency magnetron sputtering in a reactive gas environment in a planar sputtering system without tilting the substrate, showing zero tilt angle at the center, and a radially symmetrical variation of tilt angle of crystallites in the AlN film structure.
Figure 2B:
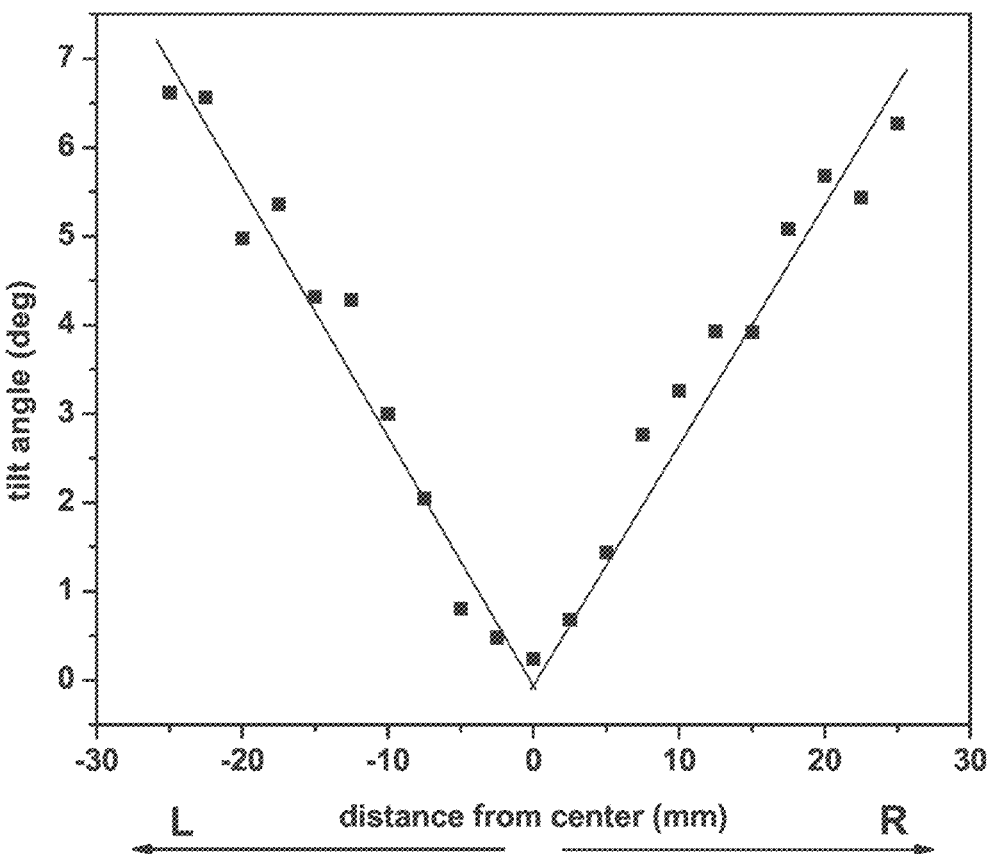
FIG. 2B is a plot of tilt angle versus distance from center for the AlN film structure described in connection with FIG. 2A, showing a nearly linear variation of tilt angle with increasing distance away from a center of the AlN film structure.
Figures 4A, 4B, 4C:
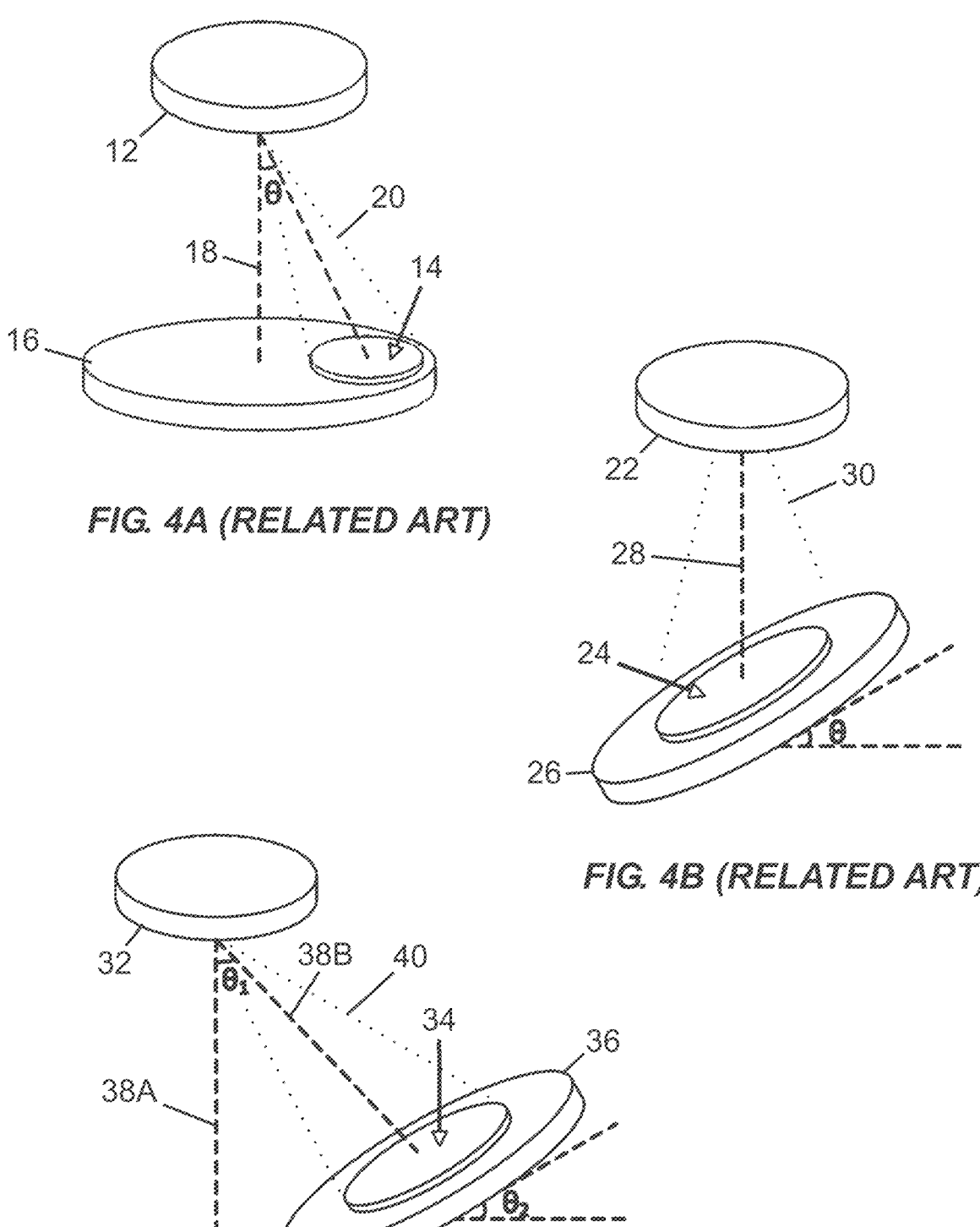
FIG. 4A is a simplified schematic of an off-axis sputtering deposition apparatus arranged to eject metal atoms from a target surface toward a substrate supported by a substrate holder substantially parallel to the target surface, with central axes of the substrate and the target surface being parallel but offset relative to one another.
FIG. 4B is a simplified schematic of a sputtering deposition apparatus arranged to eject metal atoms from a target surface toward a substrate supported by a substrate holder that is non-parallel to the target surface, with a central axis of the target surface extending through a center point of the substrate.
FIG. 4C is a simplified schematic of a sputtering deposition apparatus arranged to eject metal atoms from a target surface toward a substrate supported by a substrate holder that is non-parallel to the target surface, with a central axis of the substrate extending through a center point of the target surface, and with a central axis of the target surface being separated from the central axis of the substrate by a first angle, and with the substrate holder being tilted by a second angle relative to a plane parallel with the target surface.
Figure 5A:
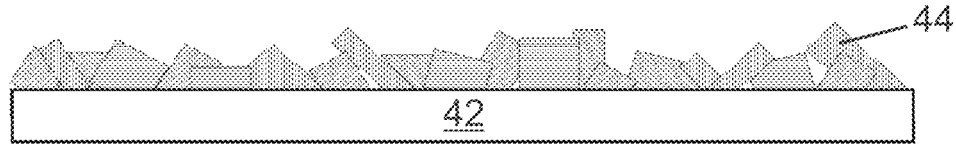
FIG. 5A is a cross-sectional schematic view of a seed layer exhibiting multiple textures (e.g., (103) and (002)) deposited via a first sputtering step over a substrate.
Figure 5B:
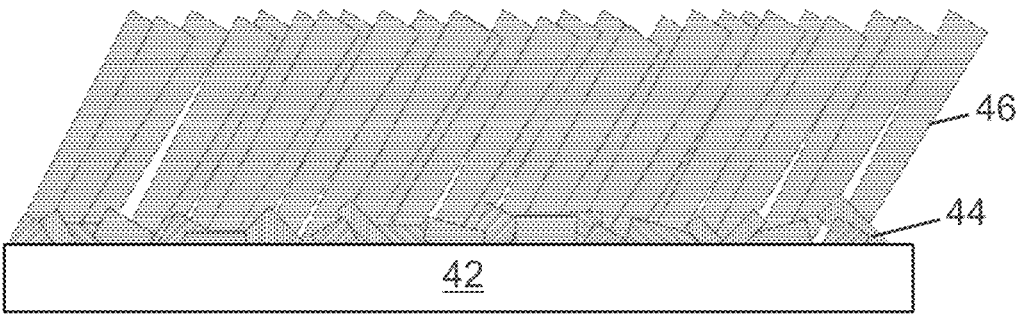
FIG. 5B is a cross-sectional schematic view of the seed layer and substrate of FIG. 5A following deposition via a second sputtering step of a tilted axis AN film over the seed layer.
Figure 6A:
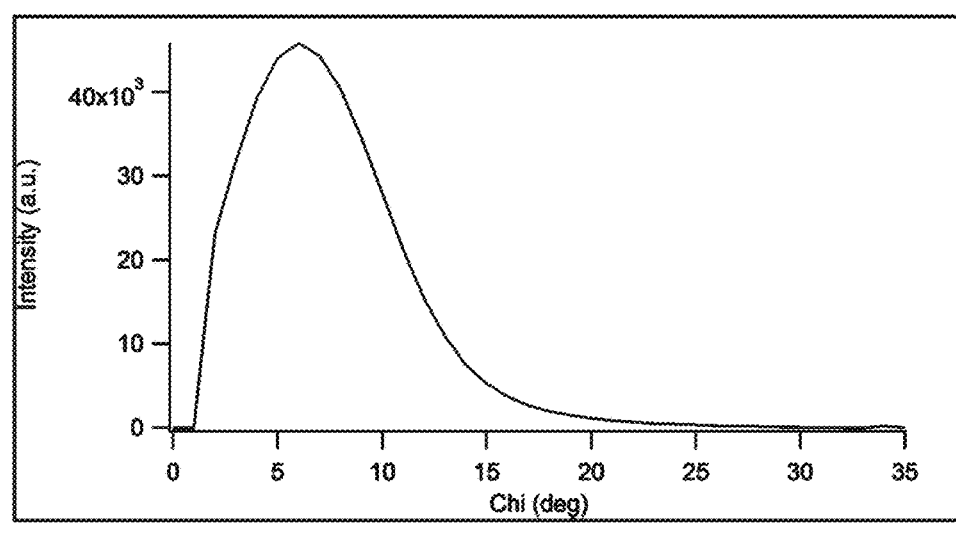
FIG. 6A is a graphical representation of the c-axis orientation distribution resulting from a prior art method without a seed layer.
Figure 6B:
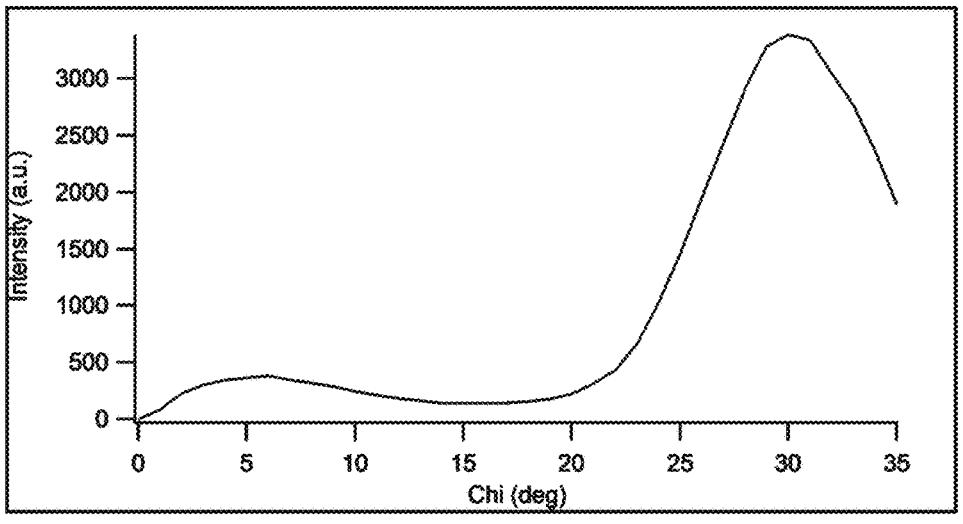
FIG. 6B is a graphical representation of the c-axis orientation distribution resulting from a prior art method with a seed layer prepared at a pressure of 5 mTorr.
Figure 6C:
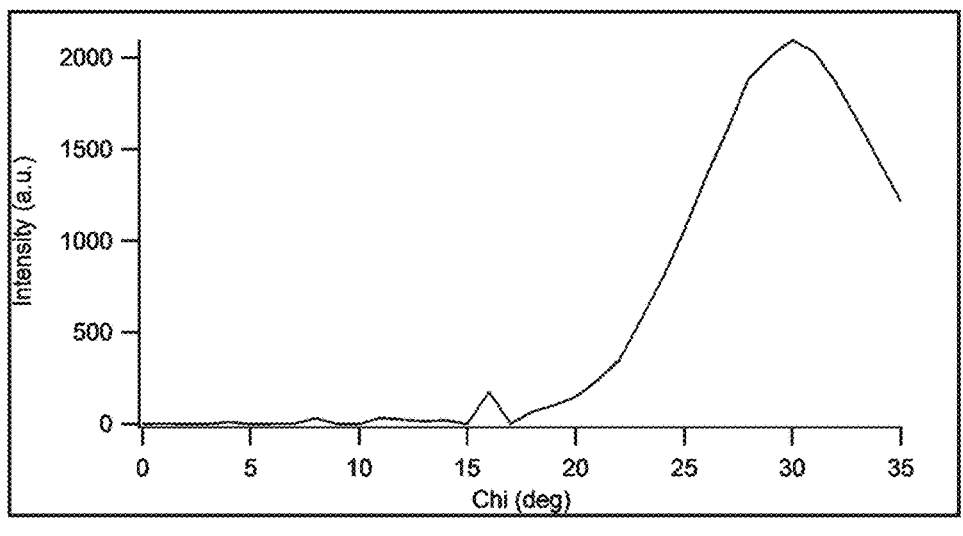
FIG. 6C is a graphical representation of the c-axis orientation distribution resulting from a prior art method with a seed layer prepared at a pressure of 15 mTorr.

While some prior art methods (such as those described in U.S. patent application Ser. No. 15/293,063 entitled "Deposition System for Growth of Inclined C-Axis Piezoelectric Material Structures;" U.S. patent application Ser. No. 15/293,071 entitled "Methods for Fabricating Acoustic Structure with Inclined C-Axis Piezoelectric Bulk and Crystalline Seed Layers;" U.S. patent application Ser. No. 15/293,082 entitled "Acoustic Resonator Structure with Inclined C-Axis Piezoelectric Bulk and Crystalline Seed Layers;" U.S. patent application Ser. No. 15/293,091 entitled "Multi-Stage Deposition System for Growth of Inclined C-Axis Piezoelectric Material Structures;" and U.S. patent application Ser. No. 15/293,108 entitled "Methods for Producing Piezoelectric Bulk and Crystalline Seed Layers of Different C-Axis Orientation Distributions") are suitable for producing bulk acoustic wave resonator structures with bulk layer crystals deposited over a seed layer and having an inclined c-axis crystal structure and an improved incline distribution, those methods are still limited by the typical c-axis tilt of the material used for making the bulk layer, and require the deposition of a seed layer first for a successful deposition of a bulk layer of desired quality. For example, bulk layers prepared from AlN according to methods described in the above-mentioned disclosures are limited to a c-axis tilt distribution that is centered around about 27 degrees to about 30 degrees. The bulk layers may have a distribution where at least 75% (or at least 90%, or at least 95%) of the bulk layer crystals have a c-axis orientation between 25 degrees to 50 degrees relative to the normal of the substrate, with the highest frequency occurring at about 27 to 30 degrees. A typical c-axis orientation distribution resulting from a prior art method is demonstrated in FIGS. 6B and 6C. In FIG. 6B, the bulk layer was deposited over a seed layer prepared at a pressure of 5 mTorr. In FIG. 6C, the bulk layer was deposited over a seed layer prepared at a pressure of 15 mTorr. As can be seen, the highest frequency of c-axis orientation occurs at about 27-28 degrees when the bulk layer is deposited on a seed layer. FIG. 6A depicts the c-axis orientation distribution of a bulk layer deposited without a seed layer under prior art deposition conditions, which results in a c-axis tilt substantially less than when deposited on a seed layer (compare to FIGS. 6B and 6C). Due, at least in part, to the substantially lower c-axis tilt when no seed layer was employed, the shear to longitudinal coupling ratio was substantially less when no seed layer was employed (ratio less than 0.5 when no seed layer vs. ratio greater than 1.5 with seed layer deposited at 15 mTorr).

The desired c-axis tilt depends on the intended purpose, use, and effect of the bulk layer. For example, in some cases it may be desirable to increase shear mode excitation. As discussed previously, the shear coupling coefficient for a bulk acoustic wave resonator comprising a bulk layer of AlN exceeds the longitudinal coupling coefficient for c-axis angle of inclination values in a range of from about 19 degrees to about 63 degrees. A greater difference between the shear mode and longitudinal coupling is achieved approximately between 30 degrees and 52 degrees, and a pure shear mode resonance response (with zero longitudinal coupling) can be obtained at a c-axis angle of inclination of about 46 degrees. Therefore, it would be desirable to be able to prepare an AlN bulk layer with a c-axis tilt of between about 30 degrees and about 52 degrees, between about 32 degrees and about 50 degrees, between about 35 degrees and about 48 degrees, or about 46 degrees. In some embodiments, shear mode excitation may be increased by depositing a bulk layer with a c-axis tilt of about 30 degrees to about 52 degrees, about 32 degrees to about 50 degrees, or about 35 degrees to about 48 degrees. Other angles of the c-axis tilt may also be useful in other embodiments. For example, c-axis tilts of about 30 degrees to about 45 degrees, about 32 degrees, or about 90 degrees could be of interest in some embodiments.

The term "c-axis" is used here to refer to the (002) direction of a deposited crystal with a hexagonal wurtzite structure. The c-axis is typically the longitudinal axis of the crystal.

The terms "c-axis tilt," "c-axis orientation," and "c-axis incline" are used here interchangeably to refer to the angle of the c-axis relative to a normal of the surface plane of the deposition substrate.

The term "incidence angle" is used here to refer to the angle at which atoms are deposited onto a substrate, measured as the angle between the deposition pathway and a normal of the surface plane of the substrate.

The term "substrate" is used here to refer to a material onto which a seed layer or a bulk layer may be deposited. The substrate may be, for example, a wafer, or may be a part of a resonator device complex or wafer, which may also include other components, such as an electrode structure arranged over at least a portion of the substrate. However, a seed layer is not considered to be "a substrate" in the embodiments of this disclosure.

The term "substantially" as used here has the same meaning as "nearly completely," and can be understood to modify the term that follows by at least about 90%, at least about 95%, or at least about 98%.

The terms "parallel" and "substantially parallel" with regard to the crystals refer to the directionality of the crystals. Crystals that are substantially parallel not only have the same or similar c-axis tilt but also point in the same or similar direction.

The term "about" is used here in conjunction with numeric values to include normal variations in measurements as expected by persons skilled in the art, and is understood have the same meaning as "approximately" and to cover a typical margin of error, such as ±5% of the stated value.

All scientific and technical terms used herein have meanings commonly used in the art unless otherwise specified. The definitions provided herein are to facilitate understanding of certain terms used frequently herein and are not meant to limit the scope of the present disclosure.

As used here, the singular forms "a", "an", and "the" encompass embodiments having plural referents, unless the content clearly dictates otherwise.

As used here, the term "or" is generally employed in its sense including "and/or" unless the content clearly dictates otherwise. The term "and/or" means one or all of the listed elements or a combination of any two or more of the listed elements.

As used here, "have", "having", "include", "including", "comprise", "comprising" or the like are used in their open-ended sense, and generally mean "including, but not limited to." It will be understood that "consisting essentially of," "consisting of," and the like are subsumed in "comprising" and the like. As used herein, "consisting essentially of" as it relates to a composition, product, method or the like, means that the components of the composition, product, method or the like are limited to the enumerated components and any other components that do not materially affect the basic and novel characteristic(s) of the composition, product, method or the like.

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure, including the claims.

The recitations of numerical ranges by endpoints include all numbers subsumed within that range (e.g., 1 to 5 includes 1, 1.5, 2, 2.75, 3, 3.80, 4, 5, etc. or 10 or less includes 10, 9.4, 7.6, 5, 4.3, 2.9, 1.62, 0.3, etc.). Where a range of values is "up to" a particular value, that value is included within the range.

Any direction referred to here, such as "top," "bottom," "left," "right," "upper," "lower," and other directions and orientations are described herein for clarity in reference to the figures and are not to be limiting of an actual device or system or use of the device or system. Devices or systems as described herein may be used in a number of directions and orientations.

The present disclosure relates in various aspects to bulk acoustic wave resonator structures and to methods for fabricating such resonator structures. As compared to conventional resonator structures, fabrication methods, and deposition systems, various embodiments of the present disclosure include or enable inclined c-axis piezoelectric films with a preselected c-axis tilt angle with an increased range of selectable angles. The inclined c-axis piezoelectric films may also exhibit improved mechanical quality factor, reduced acoustic losses, and/or reduced ohmic (electrical) losses. The inclined c-axis piezoelectric films may be fabricated over large areas (e.g., large area substrates) with increased uniformity of c-axis tilt angle. The methods for making the inclined c-axis piezoelectric films may be simpler and/or include fewer steps than prior art methods for preparing inclined c-axis piezoelectric films.

In various aspects, bulk acoustic wave resonator structures and methods for fabricating such resonator structures include deposition of the bulk layer directly on the substrate (without a seed layer). Improved coupling efficiency and mechanical quality factor may result from the elimination of a layer (e.g., a seed layer), even when the layer (e.g., seed layer) might be formed from the same material as the bulk layer. In some embodiments, the resonator structures are formed by depositing the bulk layer directly on the substrate, and exhibit an improved mechanical quality factor, reduced acoustic losses, and/or reduced ohmic (electrical) losses. The resonator structures also exhibit increased uniformity of the c-axis tilt angle over large areas.

According to at least some embodiments of the present disclosure, the c-axis tilt of the bulk layer may be adjusted by depositing the bulk layer at the desired angle under certain initial deposition conditions. According to some embodiments, the initial deposition conditions are such that they retard the surface mobility of atoms while the bulk layer is being deposited. In at least some embodiments, the bulk layer with a pre-selected c-axis tilt can be deposited under the initial deposition conditions without first depositing a seed layer. Without wishing to be bound by theory, it is believed that slowing down the surface mobility of atoms favors kinetics over thermodynamics, and allows the atoms being deposited to respond to changes in the deposition environment.

The bulk layers of the present disclosure can be prepared in any suitable deposition system. One example of a suitable deposition system is described in U.S. patent application Ser. No. 15/293,063 entitled "Deposition System for Growth of Inclined C-Axis Piezoelectric Material Structures." The main aspects of the deposition system are summarized below. However, the methods of the present disclosure are not particularly limited by the system used, and other suitable systems may also be used.

The crystalline layers of the present disclosure can be prepared in a deposition system incorporating a multi-aperture collimator arranged between a target surface of a linear sputtering apparatus and a substrate table that supports one or more wafers or substrates for receiving sputter-deposited material.

Figure 8:
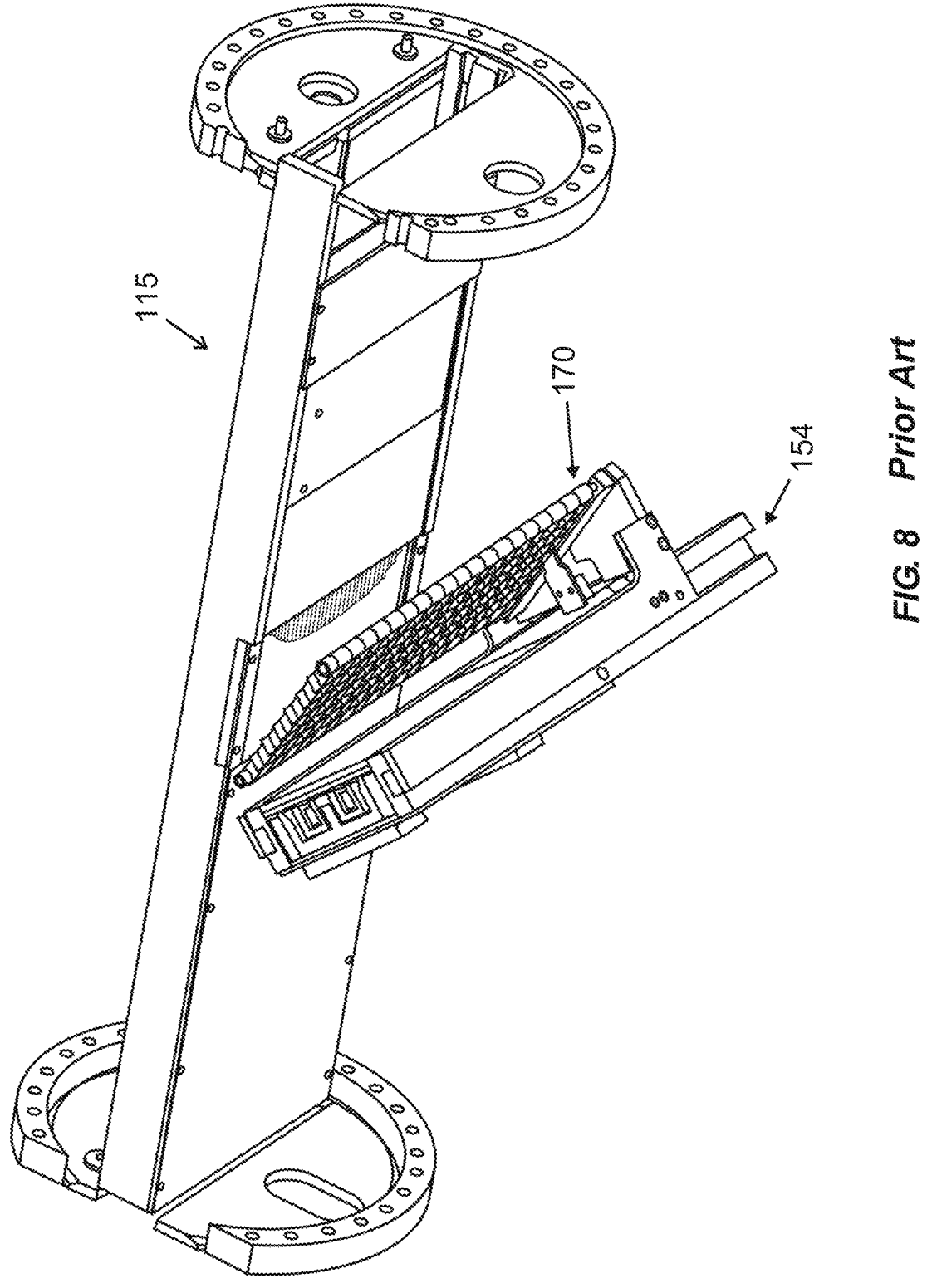
FIG. 8 is an upper perspective view of some of the elements of the reactor of FIG. 7, including a linear sputtering apparatus, a translation track for translating a movable substrate table for supporting multiple substrates, and a collimator.

An exemplary deposition system is shown in FIG. 7, which is an upper exterior perspective view of the reactor 100 of the deposition system for growing a hexagonal crystal structure piezoelectric materials. The reactor 100 includes first, second, and third tubular portions 102, 120, 108 for housing various elements used for depositing material onto a substrate. FIG. 8 depicts an upper perspective view of some of the elements of the reactor 100, including a linear sputtering apparatus 154, a translation track 115 for translating a movable substrate table for supporting multiple substrates, and a collimator assembly 170.

The target surface may be non-parallel to the substrate table, and the intermediately arranged collimator may be non-parallel to both the target surface and the substrate table. The collimator and the substrate table are preferably both capable of movement (e.g., translation) during sputtering, and at least one of the substrate table or the collimator is preferably biased to an electrical potential other than ground. The system may be used to grow (e.g., deposit) a crystalline seed layer during a first step, followed by growth of a hexagonal crystal structure piezoelectric material bulk layer over the crystalline seed layer during a second step under conditions that differ from the first step. Alternatively, according to the methods of the present disclosure, the bulk layer may be deposited directly onto the substrate without first depositing a seed layer.

According to an embodiment, the bulk layer is grown (e.g., deposited) in a single step, using a single sputtering apparatus. The growth step may be performed with a deposition system utilizing a linear sputtering apparatus, a substrate table that is translatable between different positions within the linear sputtering apparatus, and a collimator arranged between the substrate table and the linear sputtering apparatus. A hexagonal crystal structure piezoelectric material bulk layer may be grown in an enclosure in which subatmospheric conditions may be generated using at least one vacuum pumping element, and a wafer or substrate supporting the bulk layer may be translated within the enclosure. The linear sputtering apparatus, which may include a linear magnetron or a linear ion beam sputtering apparatus, includes a target surface configured to eject metal (e.g., aluminum or zinc) atoms, with the target surface being non-parallel to (e.g., oriented at 0 to less than 90 degrees from) the support surface. Preferably, the collimator is also arranged non-parallel to the support surface. In certain embodiments, a target surface is arranged at a first nonzero angle relative to a support surface, and a collimator is arranged at a second nonzero angle relative to the support surface, wherein the first nonzero angle is greater than the second nonzero angle. Metal atoms ejected from the target surface react with a gas species contained in a gas-containing environment to form the material to be deposited (e.g., piezoelectric material). For example, aluminum atoms ejected from an aluminum or aluminum-containing target surface may react with nitrogen gas species to form aluminum nitride, or zinc atoms ejected from a zinc or zinc-containing target surface may react with oxygen gas species to form zinc oxide.

The support surface of the substrate table may be configured to receive one or more wafers to be used as deposition substrates, preferably having a diameter in a range of at least about 50 mm, about 100 mm, or about 150 mm. The substrate table may be coupled to a movable element (e.g., a translation element) configured to move the substrate table during operation of the linear sputtering apparatus. Movement of the substrate table may promote uniform material deposition over large areas by preventing localized material deposition regions of different thicknesses. The exemplary collimator includes multiple guide members arranged non-parallel to the support surface, such as a plurality of longitudinal members and a plurality of transverse members, that form a grid defining multiple collimator apertures. Electrical biasing of the substrate table and/or the collimator to a potential other than ground enhances control of material deposition during operating of the sputtering apparatus. Collimator biasing may also influence microstructure development of tilted c-axis piezoelectric bulk material in a bulk acoustic wave resonator device. The substrate table and the collimator may be independently biased to electrical potentials other than ground. Separate guide members of the collimator may also be electrically biased differently relative to one another. The collimator may be configured to translate during operation of the linear sputtering apparatus to prevent formation of a "shadow" pattern that could otherwise be formed on a surface receiving deposited piezoelectric material. A deposition aperture may be arranged between the collimator and the substrate table.

According to some embodiments, an acoustic resonator structure is prepared in a deposition system where at least one wafer comprising a substrate is received by a support surface. An acoustic reflector structure may be arranged over the substrate and an electrode structure arranged over at least a portion of the acoustic reflector structure, as may be useful to produce at least one solidly mounted bulk acoustic wave resonator device. In certain other embodiments, the at least one wafer includes a substrate defining a recess, a support layer is arranged over the recess, and an electrode structure is arranged over the support layer. In describing the method here, deposition simply onto "a substrate" may be described. However, it is to be understood that the substrate may be a part of a resonator device complex or wafer, which may also include other components, such as an electrode structure arranged over at least a portion of the substrate.

According to at least some embodiments of the present disclosure, the bulk layer has a c-axis tilt that can be pre-selected. The methods of the present disclosure result in a bulk layer where the crystals of the bulk layer align with or substantially align with the pre-selected c-axis tilt. In some embodiments, the distribution of the c-axis tilt of the crystals is such that at least 75%, at least 80%, at least 85%, at least 90%, or at least 95% of the crystals in the bulk layer have a c-axis tilt that is within a range of the pre-selected c-axis tilt, such as within 1 to 10 degrees, within 1 to 8 degrees, within 1 to 5 degrees, or within 1 to 3 degrees of the pre-selected c-axis tilt. The crystals of the bulk layer may also be substantially parallel with each other. For example, at least 50%, at least 75%, or at least 90% of the crystals may have a direction that is within 0 degrees to 45 degrees, or within 0 degrees to 20 degrees of the average crystal direction.

In one aspect, the disclosure relates to a method for fabricating at least one acoustic resonator structure, wherein the growth step includes deposition of a hexagonal crystal structure bulk layer on a substrate. The deposited material may be piezoelectric material. The growth step includes ejection of metal atoms from a target surface of a linear sputtering apparatus to react with a gas species and to be received by the substrate.

In some embodiments, the bulk layer is deposited under deposition conditions (or initial deposition conditions), including an incidence angle. The incidence angle may be an off-normal incidence. For example, the incidence angle may be greater than 10 degrees, greater than 27 degrees, greater than 30 degrees, greater than 32 degrees, greater than 33 degrees, greater than 34 degrees, greater than 35 degrees, greater than 36 degrees, or greater than 40 degrees. The incidence angle may be up to about 85 degrees, up to about 75 degrees, up to about 65 degrees, up to about 56 degrees, up to about 52 degrees, up to about 50 degrees, up to about 49 degrees, or up to about 48 degrees. Illustrative incidence angles include 35 degrees, 40 degrees, 43 degrees, and 46 degrees. In some embodiments, the incidence angle is less than 32 degrees or greater than 40 degrees.

Under the deposition conditions, the resulting bulk material crystals may have a c-axis that aligns or at least substantially aligns with the incidence angle used during the deposition of the bulk layer. The resulting bulk layer crystals are substantially parallel to one another and at least substantially align with the desired c-axis tilt.

Without wishing to be bound by theory, it is hypothesized that the deposition conditions may be selected such that the deposition conditions retard the surface mobility of the atoms being deposited. The deposition conditions that may have a surface mobility retarding effect include many variables. These variables may be selected so that surface mobility is decreased to the point that the c-axis tilt of the seed layer and/or bulk layer can be controlled. The surface mobility of the atoms is a result of the variables as a whole, and not necessarily any single variable alone. When compared to conventional methods and deposition conditions for depositing bulk layers, each of the variables may be somewhat different, or only some of the variables may be different while others may remain the same as in conventional methods. Because surface mobility of atoms is difficult to determine directly, the combination of appropriate conditions may be determined based on the ability to change the c-axis tilt of the resulting crystalline layer beyond the angle(s) that is typically available for a deposited material due to crystallographic restrictions. For example, in the case of AlN, the ability to produce a crystalline layer with a c-axis tilt aligned along 32 degrees (with distribution of angles ranging from about 25 to about 35 degrees) or greater may indicate deposition conditions that favor kinetics over thermodynamics and that allow crystal growth to respond to changes in the deposition environment. Also, the ability to deposit a bulk layer directly onto a substrate (without a seed layer) at a c-axis tilt angle aligned along 20 degrees, above 25 degrees, above 30 degrees, or above 35 degrees may indicate deposition conditions that favor kinetics over thermodynamics. The crystals in the bulk layer may be aligned or substantially aligned over the area of the substrate (e.g., over the entire deposition area).

The bulk layer may be deposited directly onto a substrate (e.g., a wafer) without first depositing a seed layer. According to an embodiment, the bulk layer may be deposited under the selected deposition conditions at an off-normal incidence angle such that crystals in the resulting initial bulk layer have the desired c-axis tilt.

According to some embodiments, the deposition conditions include one or more of pressure, temperature, distance from the target to the substrate, and gas ratio. The pressure may be at least about 0.5 mTorr, at least about 1 mTorr, or at least about 1.5 mTorr. The pressure may be up to about 10 mTorr, up to about 8 mTorr, or up to about 6 mTorr. In some embodiments, the pressure is below 5 mTorr. For example, the pressure may be about 2 mTorr, about 2.5 mTorr, about 3 mTorr, about 3.5 mTorr, or about 4 mTorr. The temperature may be at least about 20° C., at least about 50° C., or at least about 100° C. The temperature may be up to about 300° C., up to about 250° C., or up to about 200° C. In some embodiments, the deposition process may generate heat but the deposition chamber is not heated by a heater.

The distance from the target to the substrate during deposition may be at least about 50 mm, at least about 75 mm, at least about 80 mm, or at least about 90 mm. The distance may be up to about 200 mm, up to about 150 mm, up to about 130 mm, or up to about 120 mm. In some embodiments, the distance from the target to the substrate during deposition may be about 108 mm to about 115 mm.

The gases in the vapor space of the deposition system may be selected based on the intended composition of the deposited layer, and may include argon and a gas that reacts with the deposited atoms, such as nitrogen or oxygen. The gas ratio of argon to reacting gas (e.g., nitrogen) in the vapor space may be from about 1:10 to about 10:10, from about 2:10 to about 8:10, or about 4:10.

The preselected c-axis tilt angle will depend on the desired or intended use of the resulting crystalline bulk layer structure. For example, the preselected angle may be any angle greater than 0 degrees and less than 90 degrees. It may be desirable to select an angle that favors shear mode resonance. For example, the preselected angle may be greater than 10 degrees, greater than 27 degrees, greater than 30 degrees, greater than 32 degrees, greater than 33 degrees, greater than 34 degrees, greater than 35 degrees, greater than 36 degrees, or greater than 40 degrees. The preselected angle may be up to about 85 degrees, up to about 75 degrees, up to about 65 degrees, up to about 56 degrees, up to about 52 degrees, up to about 50 degrees, up to about 49 degrees, or up to about 48 degrees. Exemplary preselected angles include 35 degrees and 46 degrees. In some embodiments, the preselected angle is less than 32 degrees or greater than 46 degrees.

According to at least some embodiments, the c-axis tilt of the resulting bulk layer is the same as the preselected angle or is within a range of the incidence angle and/or the preselected angle. For example, the c-axis tilt of the resulting bulk layer may be within 1 degree, within 2 degrees, within 3 degrees, within 5 degrees, within 10 degrees, or within 15 degrees of the incidence angle and/or the preselected c-axis tilt. The distribution of the c-axis tilt of the bulk layer crystals may be such that at least 75%, at least 80%, at least 85%, at least 90%, or at least 95% of the crystals in the bulk layer have a c-axis tilt that is within a range, such as within 1 degree, within 2 degrees, within 3 degrees, within 5 degrees, within 10 degrees, or within 15 degrees, of the incidence angle and/or the pre-selected c-axis tilt.

The surface of the substrate may optionally be roughened prior to deposition of the bulk layer. Roughening of the surface may improve the ability of the subsequently grown bulk layer crystals to orient during the deposition. Without wishing to be bound by theory, it is believed that roughening the surface causes shadowing effects, which may help favor orientation of the crystals toward the angle of deposition. The surface of the substrate may be roughened by, for example, atomic bombardment, creating "hills" and "valleys" on the surface.

Suitable materials for the bulk layer include piezoelectric materials or other metallic materials with a high melting point. In some embodiments the material includes a metal nitride, such as aluminum nitride, titanium nitride, hafnium nitride, tantalum nitride, zirconium nitride, vanadium nitride, niobium nitride, etc. In some embodiments the material includes a metal oxide, such as zinc oxide, tungsten oxide, hafnium oxide, molybdenum oxide, etc. In some embodiments, the material comprises a metal oxynitride, such as hafnium oxynitride, titanium oxynitride, tantalum oxynitride, etc. In some embodiments the material includes a metal carbide such as titanium carbide, niobium carbide, tungsten carbide, tantalum carbide, etc. In some embodiments the material is a refractory metal, such as zirconium, hafnium, tungsten, molybdenum, etc. The bulk layer may comprise a combination of two or more of the material described above.

In certain embodiments, a substrate table and/or collimator is configured to translate during the growth step to promote uniform material deposition. An electrode structure may be formed over at least one portion of the hexagonal crystal structure piezoelectric material bulk layer to form at least one bulk acoustic wave resonator device. An active region of bulk acoustic wave resonator device is provided in an area in which the hexagonal crystal structure piezoelectric material bulk layer is arranged between a first electrode structure and a second electrode structure. Such growth steps may be performed using a single sputtering apparatus or a deposition system utilizing multiple linear sputtering apparatuses, a substrate table that is translatable between different positions proximate to different linear sputtering apparatuses, and multiple collimators arranged between the substrate table and the respective linear sputtering apparatuses. In certain embodiments, at least one resonator device complex, over which the hexagonal crystal structure piezoelectric material bulk layer is deposited, is diced into a plurality of chips, such as solidly mounted bulk acoustic wave resonator chips or film bulk acoustic wave resonator chips.

The distribution of the c-axis orientation of the hexagonal crystal structure piezoelectric material bulk layer may be normal or bimodal. In a preferred embodiment, the distribution is normal. In certain embodiments, less than about 30%, less than about 25%, or less than about 20% of the c-axis orientation distribution of the hexagonal crystal structure piezoelectric material bulk layer is in a range of from 0 degrees to 25 degrees relative to normal of a face of the substrate. In certain embodiments, less than about 30%, less than about 25%, or less than about 20% of the c-axis orientation distribution of the hexagonal crystal structure piezoelectric material bulk layer is in a range of from 45 degrees to 90 degrees relative to normal of a face of the substrate. At least 60%, at least 65%, at least 70%, at least 75%, at least 80%, at least 85%, or at least 90% of the c-axis orientation distribution of the hexagonal crystal structure piezoelectric material bulk layer may be in a range of 25 degrees to 45 degrees. In some embodiments, at least 60%, at least 65%, at least 70%, at least 75%, at least 80%, at least 85%, or at least 90% of the c-axis orientation distribution of the hexagonal crystal structure piezoelectric material bulk layer is in a range of 30 degrees to 40 degrees.

In certain embodiments, the substrate comprises a diameter of at least about 50 mm (or at least about 100 mm, or at least about 150 mm) and the hexagonal crystal structure piezoelectric material bulk layer covers at least about 50% (or at least about 75%, or at least about 90%, or at least about 95%) of a face of the substrate. In certain embodiments, multiple bulk acoustic wave resonator devices each including an active region between a first electrode structure and a second electrode structure are provided on a single substrate. Multiple bulk acoustic resonator chips may be derived from such a substrate (e.g., by dicing), and may be incorporated in one or more sensors and/or fluidic devices.

In certain embodiments, the deposition system is configured for growth of a hexagonal crystal structure piezoelectric material bulk layer directly over a substrate (without first depositing a crystalline seed layer). The substrate may be a wafer received by the support surface, wherein at least 50% (or at least 75%, or at least 90%, or at least 95%) of the hexagonal crystal structure piezoelectric material bulk layer comprises a c-axis having an orientation distribution predominantly in a range of from 25 degrees to 50 degrees (or in a subrange of from 30 degrees to 40 degrees with a peak at about 35 degrees), or greater than 27 degrees, greater than 30 degrees, greater than 32 degrees, greater than 33 degrees, greater than 34 degrees, greater than 35 degrees, greater than 36 degrees, or greater than 40 degrees, relative to normal of a face of a substrate or wafer received by the support surface. The orientation distribution may be up to about 85 degrees, up to about 75 degrees, up to about 65 degrees, up to about 56 degrees, up to about 52 degrees, up to about 50 degrees, up to about 49 degrees, or up to about 48 degrees. Such c-axis orientation distribution is preferably substantially uniform over the area of a large area substrate (e.g., having a diameter in a range of at least about 50 mm, about 100 mm, or about 150 mm), thereby enabling multiple chips having the same or similar acoustic wave propagation characteristics to be derived from a single substrate.

In certain embodiments, a hexagonal crystal structure piezoelectric material bulk layer comprises a c-axis having an orientation distribution predominantly in a range of from 12 degrees to 52 degrees, or in a range of from 27 degrees to 37 degrees, or in a range of from 75 degrees to 90 degrees, relative to normal of a face of a substrate or wafer supporting the hexagonal crystal structure piezoelectric material bulk layer. In certain embodiments, the hexagonal crystal structure piezoelectric material bulk layer may have a thickness of about 1,000 Å (Angstrom) or greater, about 2,000 Å or greater, about 3,000 Å or greater, about 4,000 Å or greater, about 6,000 Å or greater, or about 10,000 Å or greater. The thickness of the hexagonal crystal structure piezoelectric material bulk layer may be up to about 30,000 Å, up to about 26,000 Å, or up to about 20,000 Å. Such hexagonal crystal structure piezoelectric material bulk layer preferably includes substantially uniform thickness, nanostructure, and crystallinity properties, with controlled stress and densely packed columnar grains or recrystallized grain structure. In certain embodiments, a crystalline seed layer includes a thickness in a range of from 500 Å to 2,000 Å, and (for a hexagonal crystal structure piezoelectric material such as AlN) may include a dominant (103) texture. In other embodiments, the structure does not include a seed layer.

The piezoelectric material films with a bulk layer according to embodiments of the present disclosure can be used in various bulk acoustic wave ("BAW") devices, such as BAW resonators. Exemplary BAW resonators employing the piezoelectric material films of the present disclosure are shown in FIGS. 9-11.

Figure 9:
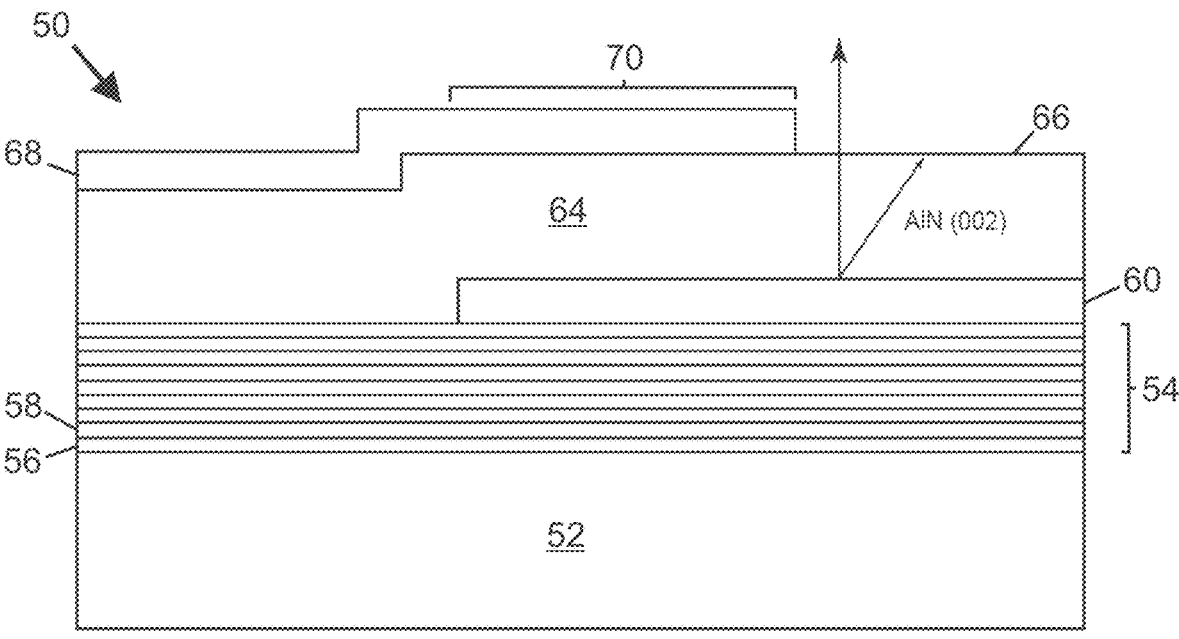
FIG. 9 is a schematic cross-sectional view of a portion of a bulk acoustic wave solidly mounted resonator device including an inclined c-axis hexagonal crystal structure piezoelectric material bulk layer as disclosed herein, with the resonator device including an active region with a portion of the piezoelectric material arranged between overlapping portions of a top side electrode and a bottom side electrode.

FIG. 9 is a schematic cross-sectional view of a portion of a bulk acoustic wave solidly mounted resonator device 50 including a piezoelectric material bulk layer 64 embodying an inclined c-axis hexagonal crystal structure piezoelectric material (e.g., AlN or ZnO) as disclosed herein. The c-axis (or (002) direction) of the piezoelectric material bulk layer 64 is tilted away from a direction normal to the substrate 52, as illustrated by two arrows superimposed over the piezoelectric material bulk layer 64. The resonator device 50 includes the substrate 52 (e.g., typically silicon or another semiconductor material), an acoustic reflector 54 arranged over the substrate 52, the piezoelectric material bulk layer 64, and bottom and top side electrodes 60, 68. The bottom side electrode 60 is arranged between the acoustic reflector 54 and the piezoelectric material bulk layer 64, and the top side electrode 68 is arranged along a portion of an upper surface 66 of the piezoelectric material bulk layer 64. An area in which the piezoelectric material bulk layer 64 is arranged between overlapping portions of the top side electrode 68 and the bottom side electrode 60 is considered the active region 70 of the resonator device 50. The acoustic reflector 54 serves to reflect acoustic waves and therefore reduce or avoid their dissipation in the substrate 52. In certain embodiments, the acoustic reflector 54 includes alternating thin layers 56, 58 of materials of different acoustic impedances (e.g., SiOC, Si$_3$N$_4$, SiO$_2$, AlN, and Mo), optionally embodied in a Bragg mirror, deposited over the substrate 52. In certain embodiments, other types of acoustic reflectors may be used. Steps for forming the resonator device 50 may include depositing the acoustic reflector 54 over the substrate 52, followed by deposition of the bottom side electrode 60, followed by growth (e.g., via sputtering or other appropriate methods) of the piezoelectric material bulk layer 64, followed by deposition of the top side electrode 68.

Figure 10:
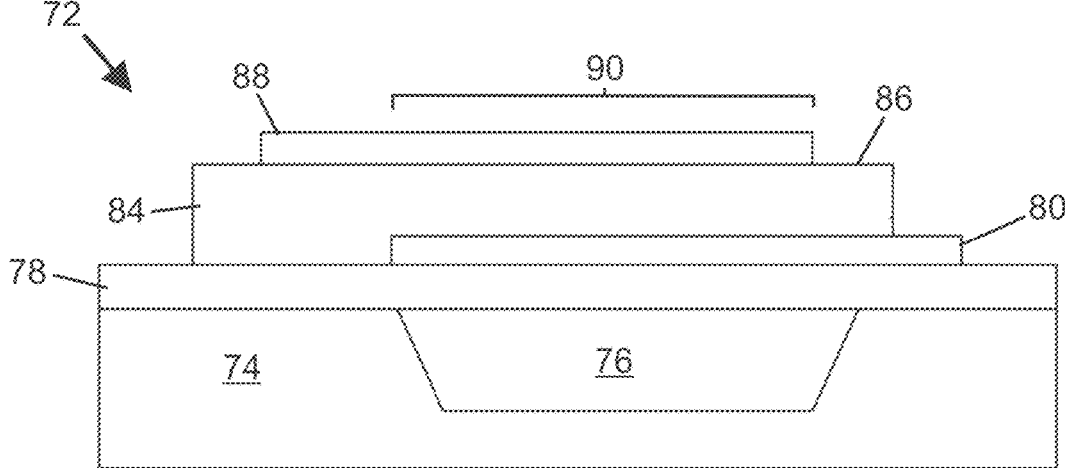
FIG. 10 is a schematic cross-sectional view of a film bulk acoustic wave resonator (FBAR) device according to one embodiment including an inclined c-axis hexagonal crystal structure piezoelectric material bulk layer arranged over a crystalline seed layer as disclosed herein, with the FBAR device including a substrate defining a cavity covered by a support layer, and including an active region registered with the cavity with a portion of the piezoelectric material arranged between overlapping portions of a top side electrode and a bottom side electrode.

FIG. 10 is a schematic cross-sectional view of a film bulk acoustic wave resonator (FBAR) device 72 according to one embodiment. The FBAR device 72 includes a substrate 74 (e.g., silicon or another semiconductor material) defining a cavity 76 that is covered by a support layer 78 (e.g., silicon dioxide). A bottom side electrode 80 is arranged over a portion of the support layer 78, with the bottom side electrode 80 and the support layer 78. A piezoelectric material bulk layer 84 embodying inclined c-axis hexagonal crystal structure piezoelectric material (e.g., AlN or ZnO) is arranged over the bottom side electrode 80, and a top side electrode 88 is arranged over at least a portion of a top surface 86 of the piezoelectric material bulk layer 84. A portion of the piezoelectric material bulk layer 84 arranged between the top side electrode 88 and the bottom side electrode 80 embodies an active region 90 of the FBAR device 72. The active region 90 is arranged over and registered with the cavity 76 disposed below the support layer 78. The cavity 76 serves to confine acoustic waves induced in the active region 90 by preventing dissipation of acoustic energy into the substrate 74, since acoustic waves do not efficiently propagate across the cavity 76. In this respect, the cavity 76 provides an alternative to the acoustic reflector 54 illustrated in FIG. 9. Although the cavity 76 shown in FIG. 10 is bounded from below by a thinned portion of the substrate 74, in alternative embodiments at least a portion of the cavity 76 extends through an entire thickness of the substrate 74. Steps for forming the FBAR device 72 may include defining the cavity 76 in the substrate 74, filling the cavity 76 with a sacrificial material (not shown) optionally followed by planarization of the sacrificial material, depositing the support layer 78 over the substrate 74 and the sacrificial material, removing the sacrificial material (e.g., by flowing an etchant through vertical openings defined in the substrate 74 or the support layer 78, or lateral edges of the substrate 74), depositing the bottom side electrode 80 over the support layer 78, growing (e.g., via sputtering or other appropriate methods) the piezoelectric material bulk layer 84, and depositing the top side electrode 88.

In certain embodiments, an acoustic reflector structure is arranged between the substrate and the at least one first electrode structure to provide a solidly mounted bulk acoustic resonator device. Optionally, a backside of the substrate may include a roughened surface configured to reduce or eliminate backside acoustic reflection. In other embodiments, the substrate defines a recess, a support layer is arranged over the recess, and the support layer is arranged between the substrate and at least a portion of the at least one first electrode structure, to provide a film bulk acoustic wave resonator structure.

EXAMPLE

BAW wafers (samples) and a blanket film were prepared according to methods of the present disclosure and compared to a baseline BAW wafer (comparative sample) and blanket film prepared according to prior art methods.

All samples, including the comparative sample, were prepared using a deposition system as described in U.S. patent application Ser. No. 15/293,063 entitled "Deposition System for Growth of Inclined C-Axis Piezoelectric Material Structures."

Four sample wafers (150 mm diameter) and a blanket film were prepared by depositing an AlN crystalline bulk layer directly onto a substrate without prior application of a seed layer. The AlN crystalline bulk layer was deposited at a deposition angle of 43 degrees. The deposition pressure was selected at 2.5 mTorr. The power, target voltage and gas flow rate were manipulated to accommodate the pressure and to achieve a deposition rate of 40 Å/min.

A comparative (baseline) sample (150 mm diameter) and a comparative blanket film were prepared by first depositing an AlN seed layer and then depositing an AlN crystalline bulk layer onto the seed layer. The seed layer was deposited at a deposition angle of 45 degrees. The deposition pressure was selected at 15 mTorr. The power, target voltage and gas flow rate were manipulated to accommodate the pressure and to achieve a deposition rate of 30 Å/min. The bulk layer was deposited at a deposition angle of 45 degrees. The deposition pressure was selected at 1 mTorr. The power, target voltage and gas flow rate were manipulated to accommodate the pressure and to achieve a deposition rate of 70 Å/min.

The blanket films were prepared to enable X-ray diffraction measurement of the c-axis angle of the AlN bulk-layer crystals. The AlN bulk-layer crystals deposited on the blanket films correspond to the AlN bulk-layer crystals deposited on the wafers under the same conditions.

The c-axis angle of the AN bulk-layer crystals on the sample blanket film and the comparative blanket film was measured by a standard X-Ray diffractometer equipped with a goniometer for pole figure measurements. The results are graphically shown in FIGS. 11A and 11B for the sample blanket film, and in FIGS. 12A and 12B for the comparative (baseline) blanket film.

Figure 11A:
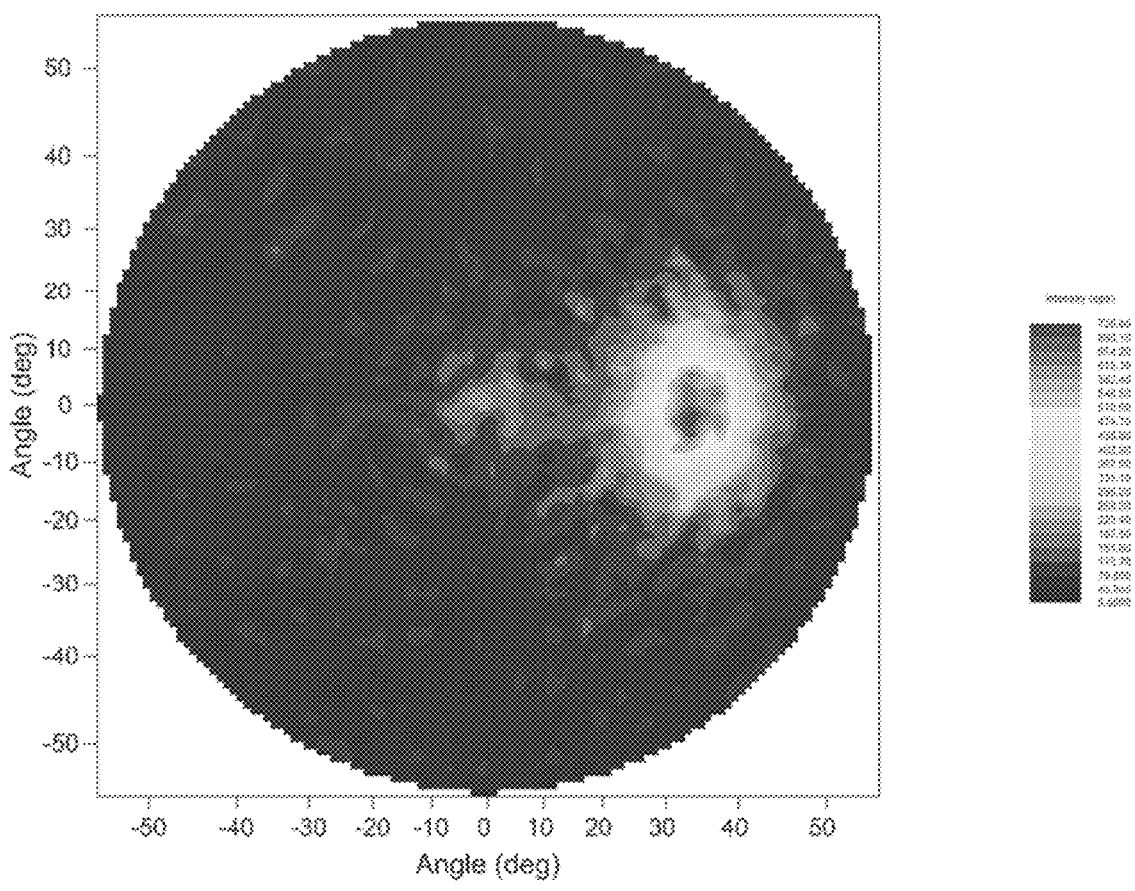
FIGS. 11A and 11B are graphical representations of the c-axis angle of samples from an Example.
Figure 11B:
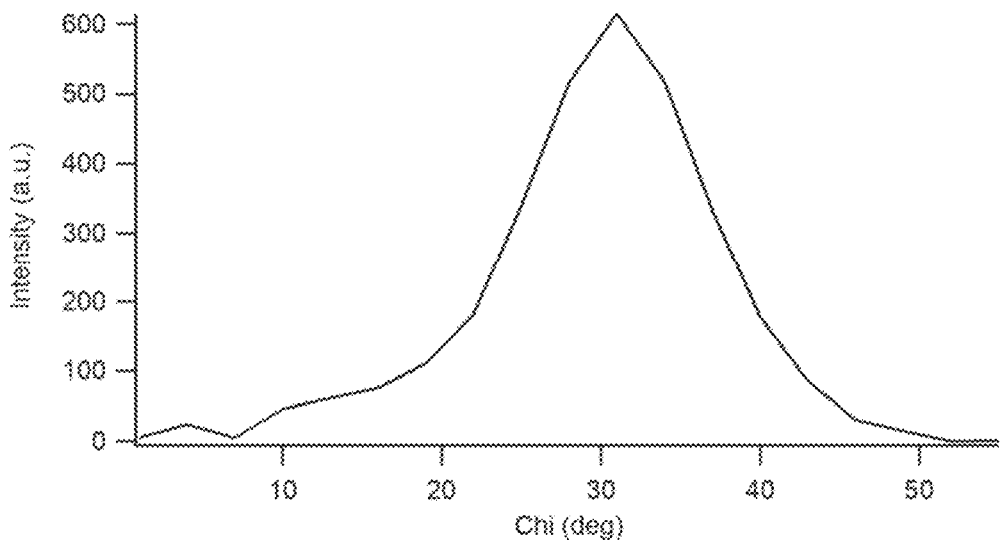
Figure 12B:
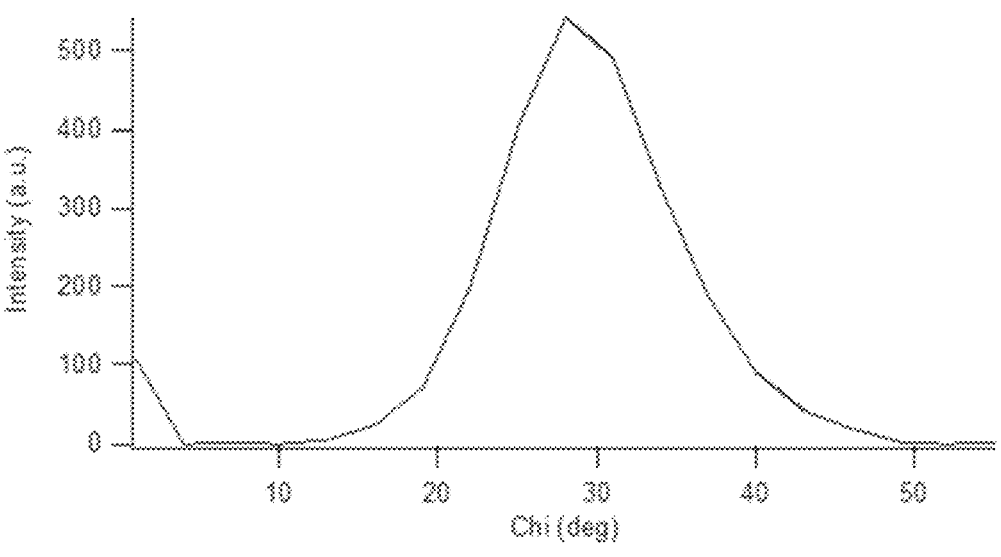

It was observed that the samples had a c-axis tilt angle of approximately 35 degrees, whereas the comparative sample had a c-axis tilt angle of approximately 30 degrees despite the deposition angle being 2 degrees greater in the comparative sample, as seen in the pole FIGS. 11A and 12A, respectively. It should be noted that the deposition angles given in this example are nominal settings of the deposition system and some variation may be experienced in the actual range of angles at which the deposition flux contacts the substrate. However, the relative magnitude of the angles can still be compared.

The effective electromechanical coupling coefficient and mechanical quality factor of each wafer were evaluated by investigating the scattering (S−) parameter matrices of the samples using a vector network analyzer to extract resonator performance characteristics. Electrical probing was performed across 100 locations on each wafer, and the results were calculated as normalized averages.

Methods for computing quality factor (Q) and effective coupling coefficient ($k^2_{eff}$) were based on work published by K. M. Lakin, "Modeling of Thin Film Resonators and Filters" IEEE MTT-S Microwave Symposium Digest, 1992 pp. 149-152. Quality factor is determined utilizing the following expression:

$$Q = \frac{1}{2} \times \text{frequency} \times \frac{dZphase}{dfrequency}$$

Effective coupling coefficient is determined by measuring series ($f_s$) and parallel ($f_p$) resonant frequencies and utilizing the following formula:

$$k^2_{eff} = \frac{\varphi s}{\tan \varphi s} \text{ where } \varphi s = \frac{\pi}{2}\left(\frac{fs}{fp}\right)$$

Figure 13:
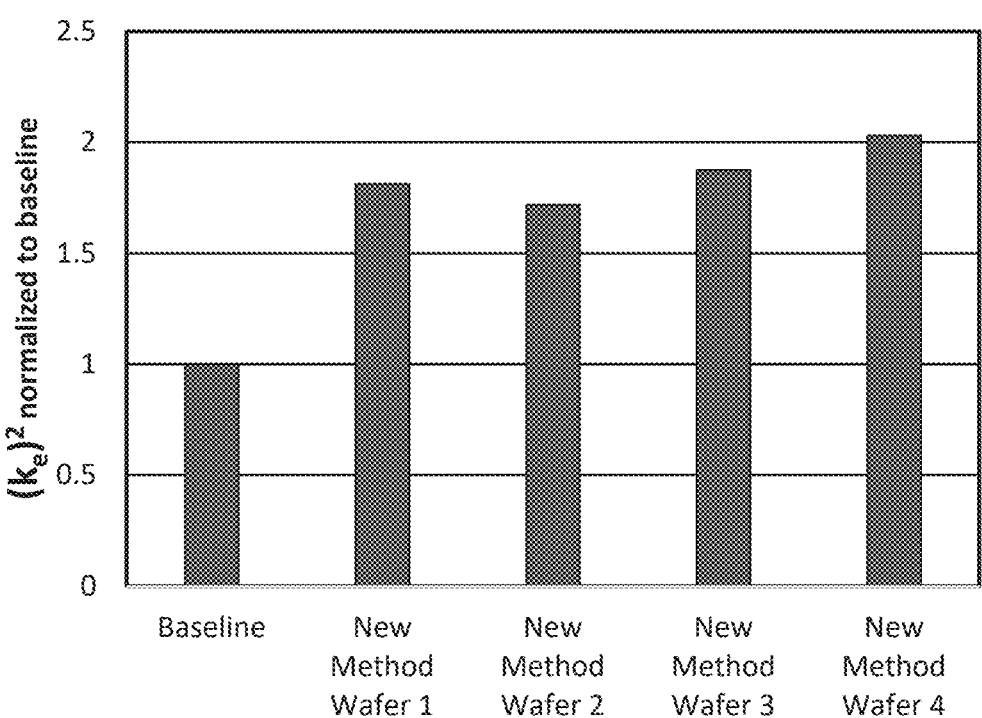
FIG. 13 is a graphical representation of electromechanical coupling of samples and the comparative sample of the Example.
Figure 14:
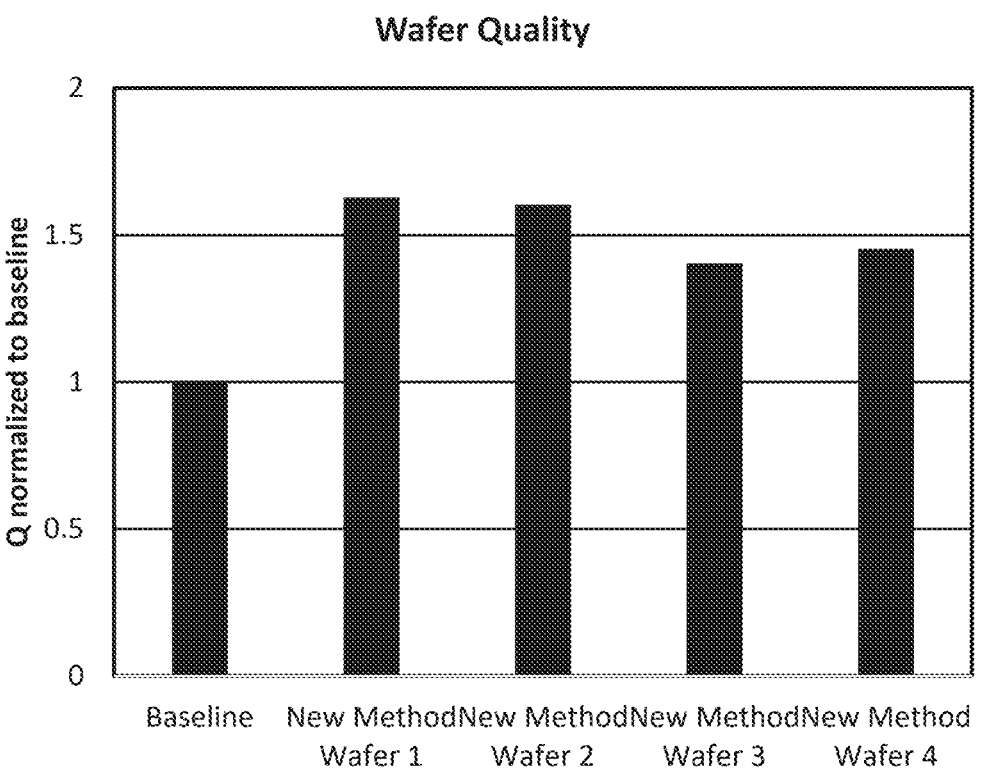
FIG. 14 is a graphical representation of wafer quality of samples and the comparative sample of the Example.

The results are graphically shown in FIG. 13 showing electromechanical coupling coefficient $(k_e)^2$ and in FIG. 13 showing mechanical quality factor (Q) normalized to the comparative (baseline) sample.

It was observed that the electrical performances of sample films grown under deposition conditions according to the present disclosure were comparable to or better than the comparative (baseline) sample. The effective electromechanical coupling coefficient $(k_e)^2$ measured on the sample wafers was approximately twice as good as the comparative (baseline) sample. The mechanical quality factor (Q) measured on the sample wafers was approximately 1.5 times better than the comparative (baseline) sample.

The sample c-axis angles achieved in this experiment were limited by the available incidence angles using the particular deposition system. However, the results demonstrate that angles can be selected outside of the 27-30 degrees of the prior art methods. Angles outside of 27-30 degrees are achievable using the methods of the present disclosure.

The complete disclosures of the patents, patent documents, and publications identified herein are incorporated by reference in their entirety as if each were individually incorporated. To the extent there is a conflict or discrepancy between this document and the disclosure in any such incorporated document, this document will control.

From the above disclosure of the general principles of the present invention and the preceding detailed description, those skilled in this art will readily comprehend the various modifications, re-arrangements and substitutions to which the present invention is susceptible, as well as the various advantages and benefits the present invention may provide. Therefore, the scope of the invention should be limited only by the following claims and equivalents thereof. In addition, it is understood to be within the scope of the present invention that the disclosed and claimed articles and methods may be useful in applications other than surgical procedures. Therefore, the scope of the invention may be broadened to include the use of the claimed and disclosed methods for such other applications.

The invention claimed is:

1. A piezoelectric structure with enhanced shear mode coupling, comprising:
    a substrate comprising a wafer or a portion thereof; and
    a bulk material layer with an inclined c-axis tilt, wherein the bulk material layer is deposited directly onto the substrate without first depositing a seed layer, at an off-normal incidence angle under deposition conditions comprising a pressure of less than 5 mTorr; and
wherein the piezoelectric structure exhibits a ratio of shear coupling to longitudinal coupling of 1.25 or greater during excitation.

2. The piezoelectric structure of claim 1, wherein the pressure is from about 0.5 mTorr to about 4.5 mTorr.

3. The piezoelectric structure of claim 1, wherein the pressure is from about 1 mTorr to about 4 mTorr.

4. The piezoelectric structure of claim 1, wherein the off-normal incidence angle is from about 35 degrees to about 85 degrees.

5. The piezoelectric structure of claim 1, wherein the c-axis tilt of the bulk material layer ranges from about 35 degrees to about 85 degrees.

6. A bulk acoustic wave resonator comprising the piezoelectric structure of claim 1, and further comprising a first electrode and a second electrode, wherein at least a portion of the bulk material layer is between the first electrode and the second electrode.

7. The piezoelectric structure of claim 1, wherein the bulk material layer is deposited using a linear sputtering apparatus.

8. The piezoelectric structure of claim 1, wherein the deposition conditions further comprise a temperature of 50° C. to 300° C.

9. The piezoelectric structure of claim 1, wherein the deposition conditions further comprise a deposition distance between a target surface and the substrate of 50 mm to 200 mm.

10. The piezoelectric structure of claim 1, wherein the deposition conditions further comprise a gas ratio of argon to reacting gas of 1:10 to 10:10.

11. A piezoelectric structure with enhanced shear mode coupling comprising:
    a substrate comprising a wafer or a portion thereof; and
    a bulk material layer deposited directly onto the substrate without first depositing a seed layer, at an off-normal incidence angle, wherein the bulk material layer has a c-axis tilt that ranges from about 35 degrees to about 85 degrees; and
wherein the bulk material layer exhibits a ratio of shear coupling to longitudinal coupling of 1.25 or greater during excitation.

12. The piezoelectric structure of claim 11, wherein the bulk material layer has a thickness of about 1,000 Angstroms to about 30,000 Angstroms.

13. The piezoelectric structure of claim 11, wherein the bulk material layer comprises AlN.

14. A bulk acoustic wave resonator comprising the piezoelectric structure of claim 11, and further comprising a first electrode and a second electrode, wherein at least a portion of the bulk material layer is between the first electrode and the second electrode.

15. A piezoelectric structure with a preselected c-axis tilt angle comprising:
    a substrate comprising a wafer or a portion thereof; and
    a bulk material layer deposited directly onto the substrate without first depositing a seed layer, at an off-normal incidence angle, wherein a plurality of crystals in the bulk material layer are substantially parallel to one another and are substantially oriented in a direction of the preselected c-axis tilt angle; and
wherein the piezoelectric structure exhibits a ratio of shear coupling to longitudinal coupling of 1.25 or greater during excitation.

16. The piezoelectric structure of claim 15, wherein the c-axis tilt of the bulk material layer ranges from about 35 degrees to about 85 degrees.

17. A bulk acoustic wave resonator comprising the piezoelectric structure of claim 15, and further comprising a first electrode and a second electrode, wherein at least a portion of the bulk material layer is between the first electrode and the second electrode.

*    *    *    *    *